United States Patent
Monda et al.

(10) Patent No.: US 9,500,693 B2
(45) Date of Patent: Nov. 22, 2016

(54) ELECTRONIC APPARATUS, MEASURING METHOD, AND MONITORING APPARATUS

(71) Applicants: Tomoko Monda, Kanagawa-ken (JP); Kenji Hirohata, Tokyo (JP)

(72) Inventors: Tomoko Monda, Kanagawa-ken (JP); Kenji Hirohata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 964 days.

(21) Appl. No.: 13/676,605

(22) Filed: Nov. 14, 2012

(65) Prior Publication Data

US 2013/0124118 A1    May 16, 2013

(30) Foreign Application Priority Data

Nov. 16, 2011   (JP) .................................. 2011-250826

(51) Int. Cl.
  *G01R 31/00*  (2006.01)
  *G01R 31/04*  (2006.01)

(52) U.S. Cl.
  CPC ... *G01R 31/048* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *H01L 2224/83385* (2013.01)

(58) Field of Classification Search
  CPC ............ G01R 31/2608; G01R 31/2628; G01R 31/2841; G01R 31/42
  See application file for complete search history.

(56) References Cited

U.S. PATENT DOCUMENTS 5,993,637 A * 11/1999 Hisamatsu ................ C25F 3/12
                                                      204/224 M
9,383,401 B2    7/2016 Omori et al.
(Continued)

FOREIGN PATENT DOCUMENTS

JP   H02-1477868    6/1990
JP   7-306239       11/1995
(Continued)

OTHER PUBLICATIONS

Notice of Rejection issued by the Japanese Patent Office on Oct. 21, 2014, for Japanese Patent Application No. 2011-250826, and English-language translation thereof.
(Continued)

*Primary Examiner* — Elias Desta
(74) *Attorney, Agent, or Firm* — Finnegan, Henderson, Farabow, Garrett & Dunner LLP

(57) ABSTRACT

According to an embodiment, an electronic apparatus includes a first member serving as a circuit board member; a second member serving as a circuit board member or a semiconductor device; a first electrode formed on the first member; a second electrode formed on a region, of the first member, around a region where the first electrode is formed; and a third electrode formed on the second member. The electronic apparatus also includes a electrical joint configured to bond the first electrode, the second electrode, and the third electrode; and a measuring module configured to measure an electrical characteristic value of a connection path including at least one of the first electrode and the second electrode.

15 Claims, 30 Drawing Sheets

(56) References Cited

U.S. PATENT DOCUMENTS

2002/0125043 A1\* 9/2002 Yoshida ............... H01L 22/34
174/261
2008/0265249 A1 10/2008 Sato
2010/0070204 A1 3/2010 Monda et al.

FOREIGN PATENT DOCUMENTS

| | | |
|---|---|---|
| JP | 10-74800 | 3/1998 |
| JP | 3265197 | 12/2001 |
| JP | 2001-159523 | 6/2002 |
| JP | 2007-35891 | 2/2007 |
| JP | 2008-277457 | 11/2008 |
| JP | 2009-111108 | 5/2009 |
| JP | 2009-264959 | 11/2009 |
| JP | 2010-223859 | 10/2010 |
| WO | WO 2008/149445 A1 | 12/2008 |
| WO | WO 2011/121725 A1 | 10/2011 |

OTHER PUBLICATIONS

Decision of Rejection issued by the Japanese Patent Office on Jun. 9, 2015, for Japanese Patent Application No. 2011-250826, and English-language translation thereof.
Notification of Reasons for Refusal in Japanese Patent Application No. 2015-178006, issued by the Japan Patent Office, mailed Aug. 23, 2016 (11 pages including English translation).
Office Action, in Japanese Patent Application No. 2011-250826, issued by the Japan Patent Office mailed Jul. 26, 2016.

\* cited by examiner

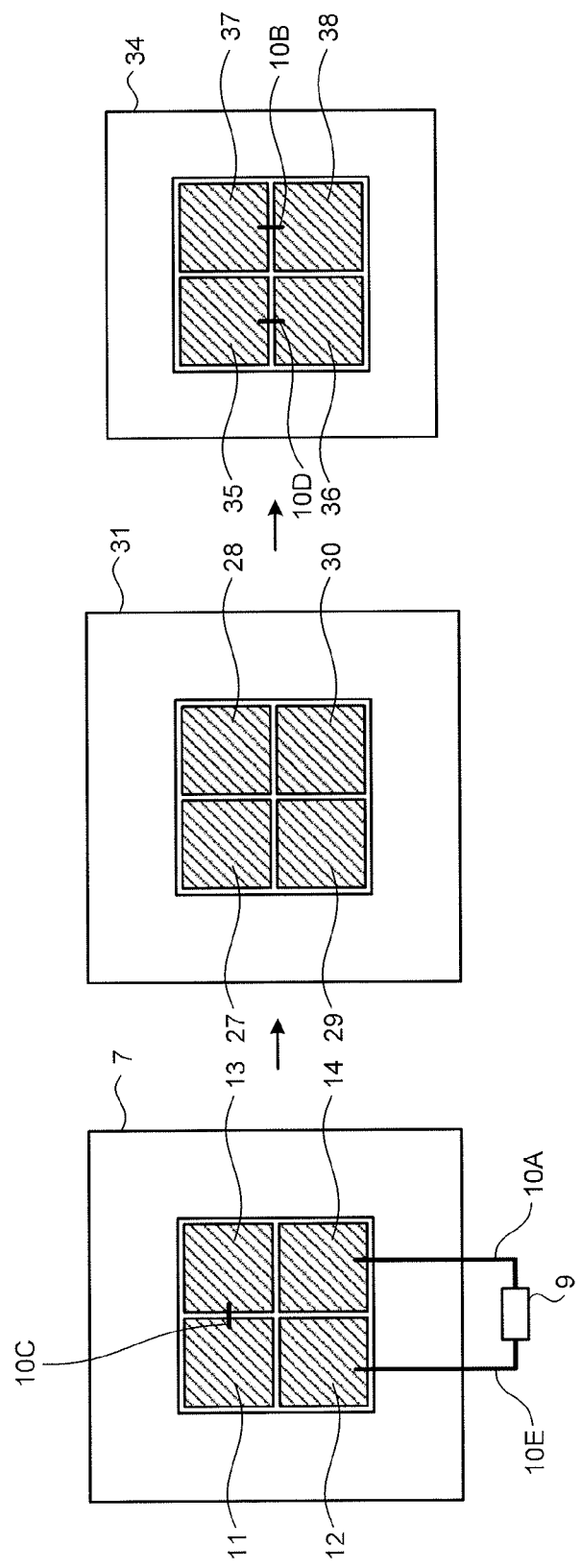

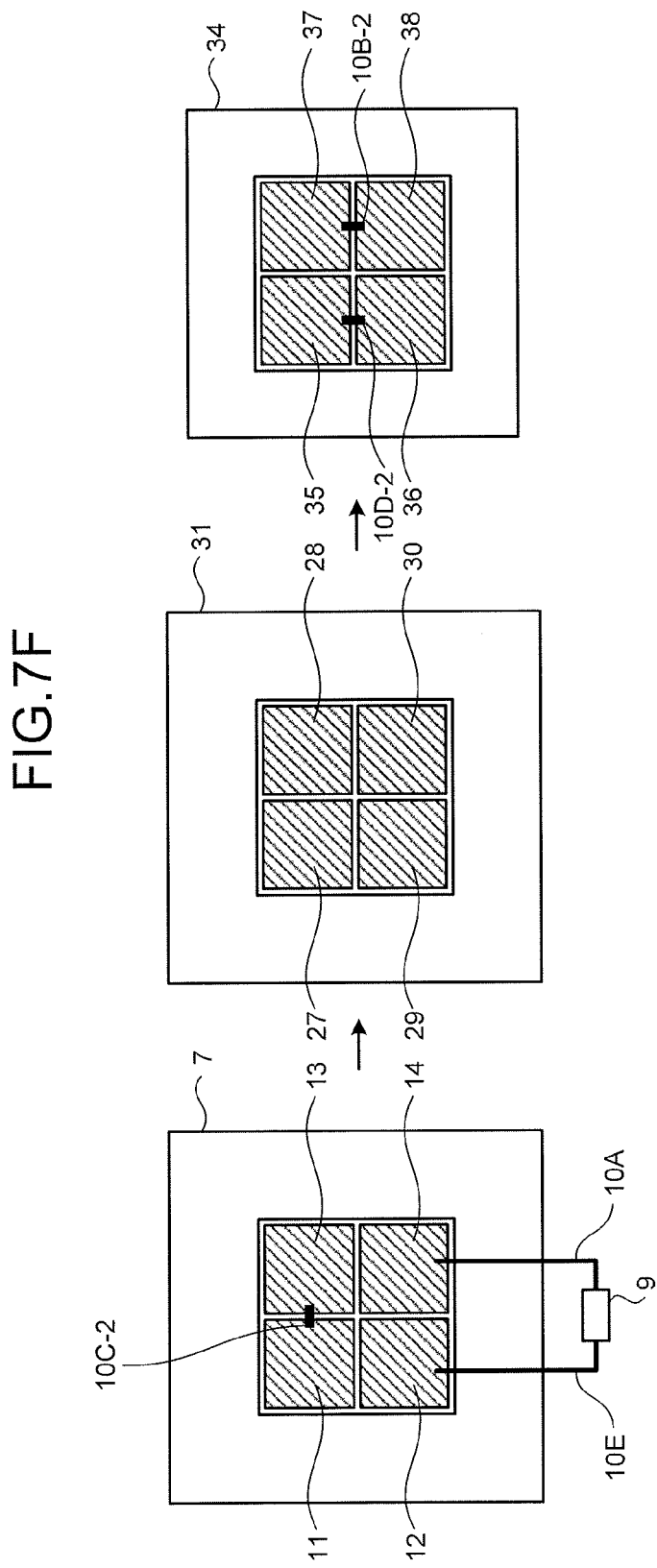

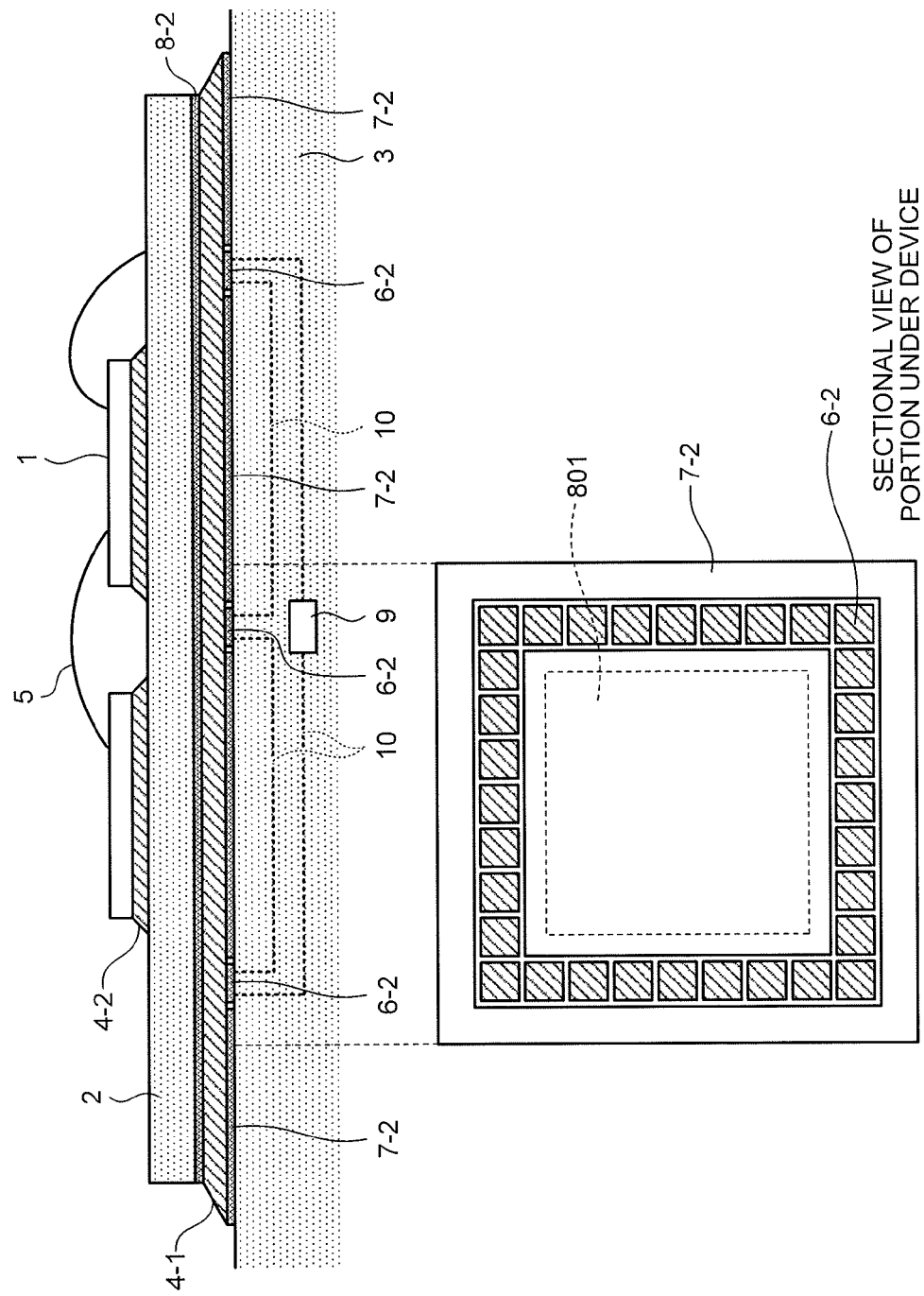

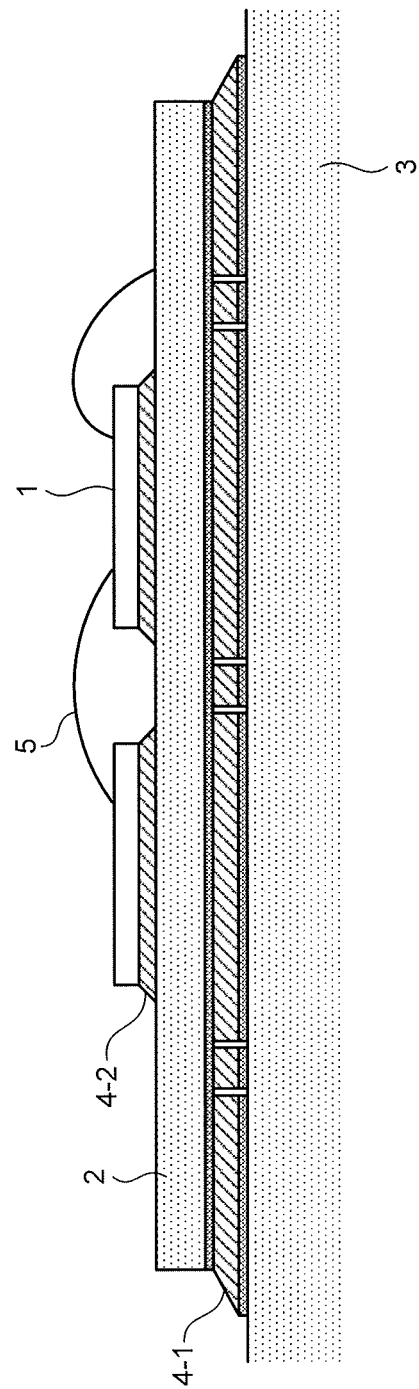

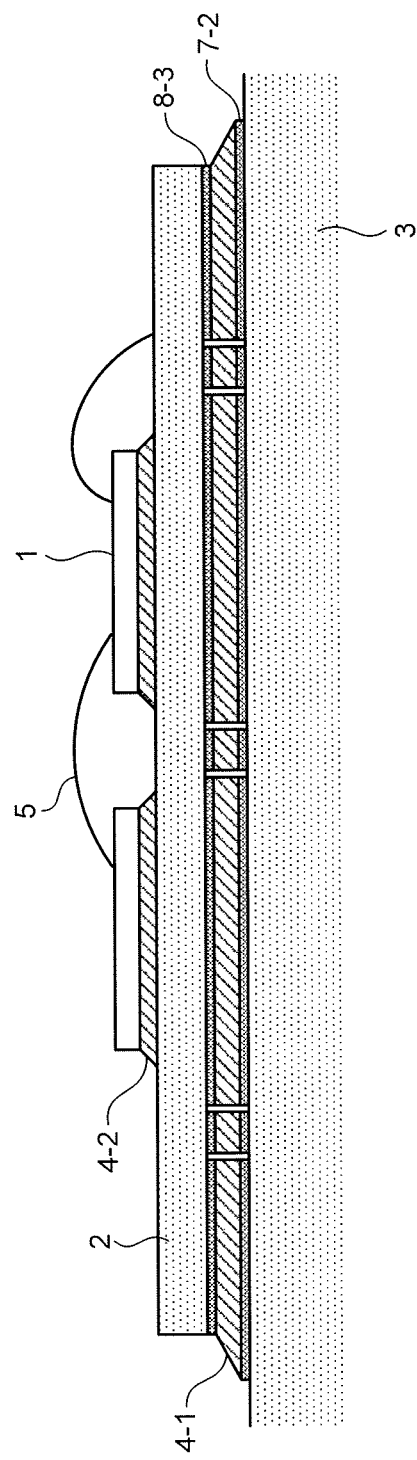

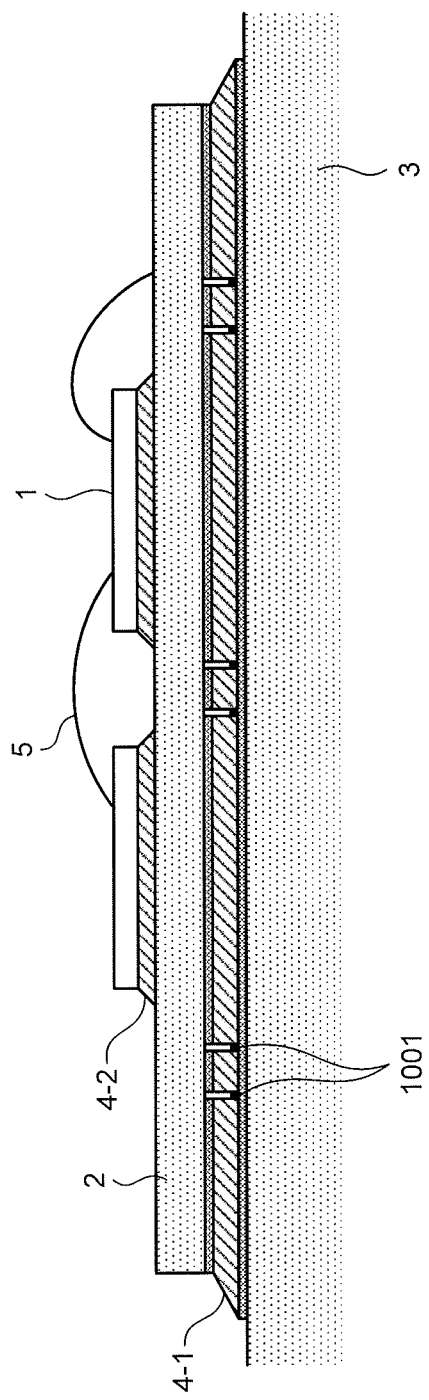

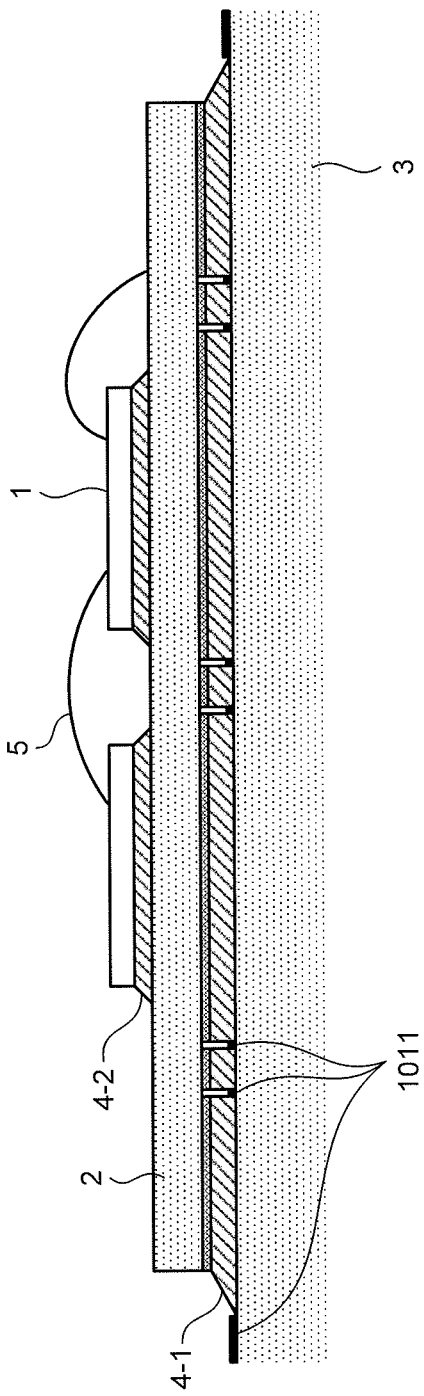

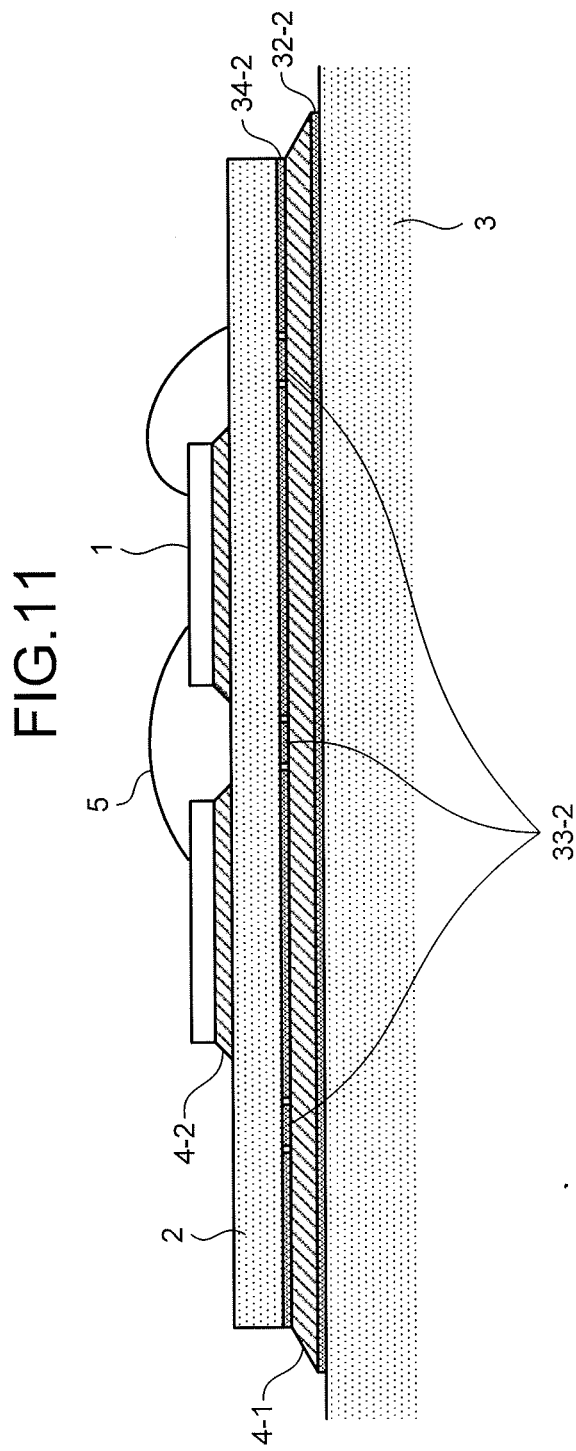

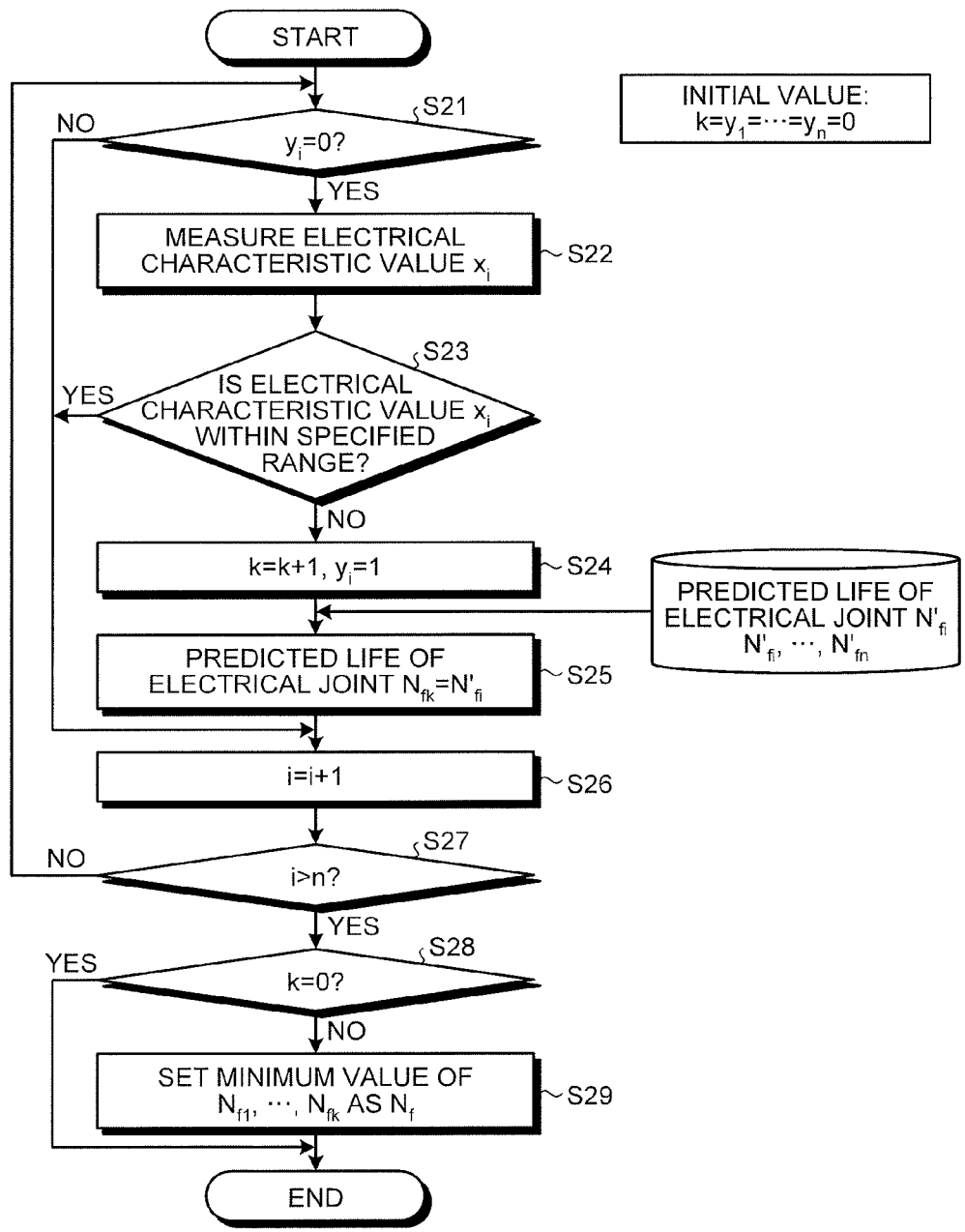

ELECTRONIC APPARATUS, MEASURING METHOD, AND MONITORING APPARATUS

CROSS-REFERENCE TO RELATED APPLICATION

This application is based upon and claims the benefit of priority from Japanese Patent Application No. 2011-250826, filed on Nov. 16, 2011; the entire contents of which are incorporated herein by reference.

FIELD

Embodiments described herein relate generally to an electronic apparatus, a measuring method, and a monitoring apparatus.

BACKGROUND

In a semiconductor module mounted to a power electronics device or an in-vehicle electronic apparatus, an internal component might be fractured during an operation due to a thermal load or a dynamic load. In the loads that cause the failure, there is a load that causes a failure when it is applied once to the device. There is also a load that causes a damage, and the caused damage is accumulated to cause the fracture of the device, when this load is applied many times. For example, a temperature variation generated due to the change in the operation state of the device causes repeated stress to a electrical joint (e.g., a electrical joint between a device and an electrode, or a solder electrical joint) by a difference in a linear expansion coefficient between components such as a device or a circuit board. When the device is installed in a condition in which a dynamic stress is applied thereto, the repeated stress is generated due to an application of inertia force. There may also be a case where the variation in the dynamic stress is superimposed on the repeated thermal load to cause repeated composite load.

Stress or distortion applied once to the device does not cause a fracture, but the repeated stress or distortion caused by the repeated load might cause a fracture.

On the other hand, there is a technique of a health monitoring as a technique of making a diagnosis of a product, which is to be used for a long term, and predicting a life to failure, in order to exchange service parts at an appropriate timing. The health monitoring technique includes various methods. One of examples for the above-mentioned electronic apparatus is to predict a life to repeated load.

Electronic apparatuss in recent years can be provided with sensors such as a temperature sensor or an acceleration sensor. Various measures can be taken according to a condition by monitoring the state of the operated device.

For example, a temperature of a computation processing component such as a central processing unit (CPU) is always sensed, and when the temperature rises to exceed a threshold value, a computation load is forcibly reduced to prevent a failure due to the temperature rise. Alternatively, an acceleration and tilt of the device are sensed by the acceleration sensor, whereby an operation of retracting a head of a hard disk drive, or an operation of starting an application designated by a user can be carried out.

These sensors are expected to be used to predict a fatigue life to the above-mentioned repeated load.

However, in such known techniques, a life cannot appropriately be predicted when a composite load formed by the superimposition of the thermal load and the dynamic load is applied. In a power semiconductor module, a semiconductor device and an insulating circuit board, as well as a circuit board and a heat spreader, are bonded through a thin-film metal bonding layer in order to secure a heat dissipation path to a cooling structure. In power semiconductor modules, semiconductor devices or the semiconductor circuit board and the circuit board are connected with a conductive member such as a metal wire or a metal thin film. In this case, a large amount of heat is locally caused on the connection surface of the semiconductor device and the conductive member. Therefore, the electrical joint immediately under the connection surface might be fractured, and there is a fear of deterioration in the heat dissipation performance due to the fracture on the electrical joint. For example, in the power semiconductor module bonded with a thin-film metal bonding layer, a fracture is not limited to be caused from a corner of the module. Even if the fracture is caused from the corner, a fracture life of the corner is far apart from the fracture life of the target electrical joint. Therefore, this is not appropriate for detecting a sign of a failure. In the known techniques, it might be difficult to preliminarily detect the sign of the failure.

BRIEF DESCRIPTION OF THE DRAWINGS

FIG. 7E is a view illustrating a connection path according to Modification 1 of the third embodiment;

FIG. 7F is a view illustrating another example of the connection path according to Modification 1 of the third embodiment;

FIG. 8A is a sectional view of an electronic apparatus according to a fourth embodiment;

FIG. 9 is a sectional view illustrating an essential part of an electronic apparatus according to Modification 1 of the fourth embodiment;

FIG. 10A is a sectional view illustrating an essential part of an electronic apparatus according to Modification 2 of the fourth embodiment;

FIG. 10F is a sectional view illustrating an essential part of an electronic apparatus according to Modification 3 of the fourth embodiment;

FIG. 10G is a sectional view illustrating an essential part of an electronic apparatus according to Modification 4 of the fourth embodiment;

FIG. 11 is a sectional view illustrating an essential part of an electronic apparatus according to a fifth embodiment;

FIG. 16 is a flowchart of another predicting process;

DETAILED DESCRIPTION

According to an embodiment, an electronic apparatus includes a first member serving as a circuit board member; a second member serving as a circuit board member or a semiconductor device; a first electrode formed on the first member; a second electrode formed on a region, of the first member, around a region where the first electrode is formed; and a third electrode formed on the second member. The electronic apparatus also includes a electrical joint configured to bond the first electrode, the second electrode, and the third electrode; and a measuring module configured to measure an electrical characteristic value of a connection path including at least one of the first electrode and the second electrode.

Preferable embodiments of an electronic apparatus, a measuring method, and a monitoring apparatus according to the present invention will be described in detail with reference to the attached drawings.

First Embodiment

Figure 1A:
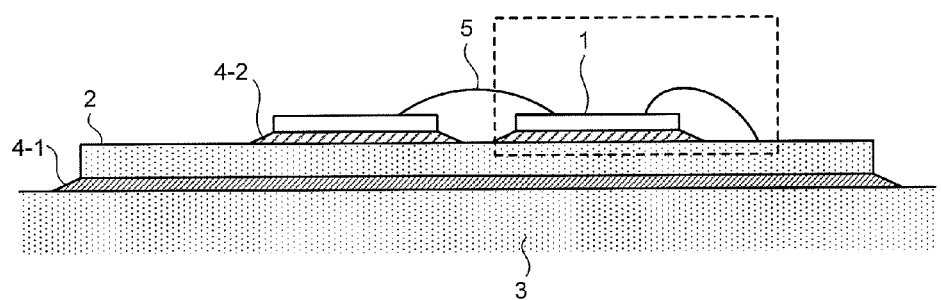
FIG. 1A is a sectional view of an electronic apparatus according to a first embodiment.
Figure 1B:
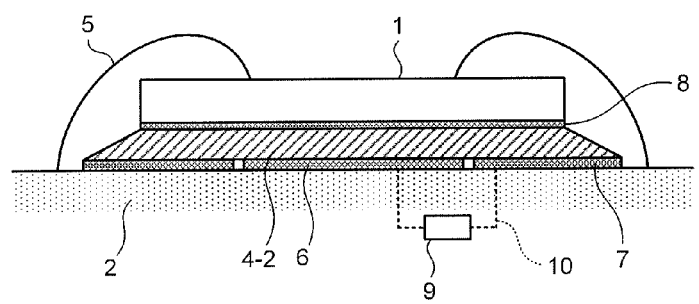
FIG. 1B is a sectional view illustrating an essential part of the electronic apparatus according to the first embodiment.
Figure 1C:
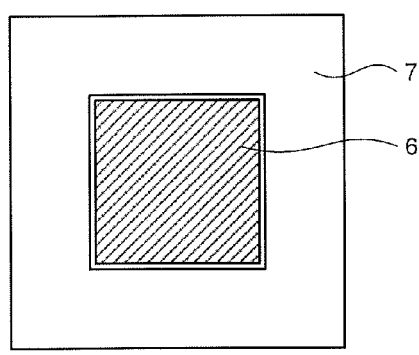
FIG. 1C is a view illustrating a shape of a circuit board electrode formed on an insulating circuit board.
Figure 1D:
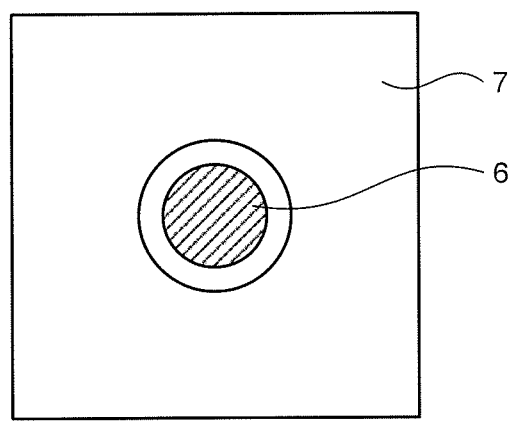
FIG. 1D is a view illustrating another example of the circuit board electrode formed on the insulating circuit board.

FIG. 1A is a sectional view schematically illustrating an entire electronic apparatus according to a first embodiment. FIG. 1B is a sectional view illustrating an essential part (a part enclosed by a fractured line in FIG. 1A) of the electronic apparatus according to the first embodiment. FIG. 1C is a view illustrating a shape of a circuit board electrode formed on an insulating circuit board. FIG. 1D is a view illustrating another shape of the circuit board electrode formed on the insulating circuit board.

As illustrated in FIG. 1A, an electronic apparatus (semiconductor package) according to the first embodiment includes a semiconductor device 1, an insulating circuit board 2, and a base plate 3. The insulating circuit board 2 is a ceramic circuit board, for example. The base plate 3 is made of copper, for example. The insulating circuit board 2 and the base plate 3 are bonded with a electrical joint 4-1. The semiconductor devices 1 are bonded to each other with a conductive member 5, and the semiconductor device 1 and the insulating circuit board 2 are also bonded to each other with the conductive member 5. The electrical joint 4-1 is a solder electrical joint, for example. The conductive member 5 is an aluminum wire, for example. The surface of the device and the aluminum wire are ultrasonically bonded to each other.

Figure 12A:
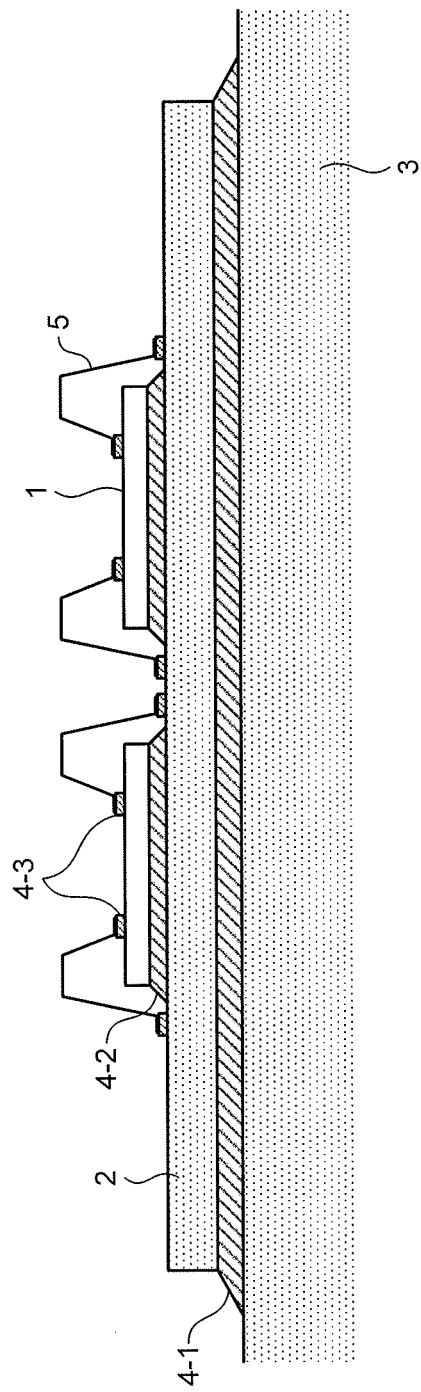
FIG. 12A is a sectional view of an electronic apparatus according to a sixth embodiment.
Figure 12B:
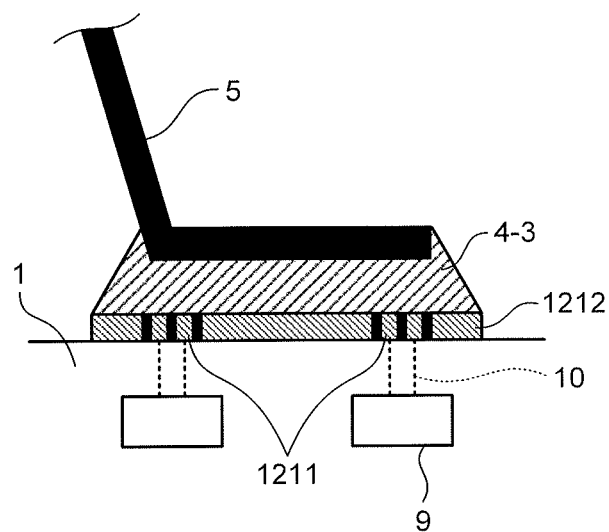
FIG. 12B is a sectional view illustrating an essential part according to the sixth embodiment.

As illustrated in FIG. 1B, a circuit board electrode 6 and a circuit board electrode 7 are formed on the surface of the insulating circuit board 2. A device electrode 8 is formed on the surface of the semiconductor device 1. The circuit board electrode 6, the circuit board electrode 7, and the device electrode 8 are bonded to a electrical joint 4-2. The electrical joint 4-2 is a solder electrical joint, for example. Unless otherwise specified, the electrical joint 4-1, the electrical joint 4-2, and a electrical joint 4-3 described with reference to FIG. 12B are sometimes referred to as a electrical joint 4.

FIG. 1C corresponds to a view when the circuit board electrode 6 and the circuit board electrode 7 formed on the insulating circuit board 2 are observed from above in the vertical direction. As illustrated in FIG. 1C, the circuit board electrode 6 is provided at the inside of the circuit board electrode 7. Specifically, the circuit board electrode 7 is formed on a region around a region where the circuit board electrode 6 is formed on the insulating circuit board 2. A gap may be formed between the circuit board electrode 6 and the circuit board electrode 7, or a resist may be applied between the circuit board electrode 6 and the circuit board electrode 7. The shape of the circuit board electrode 6 may be polygonal as illustrated in FIG. 1C, may be circular as illustrated in FIG. 1D, or may have other shape.

The circuit board electrode 6 and the circuit board electrode 7 are electrically connected to a measuring module 9 via a wiring 10. The measuring module 9 measures an electrical characteristic value of a connection path including at least one of the circuit board electrode 6 and the circuit board electrode 7. The measuring module 9 is formed on the insulating circuit board 2, for example. The connection path may be configured not to include the circuit board electrode 6. However, the connection path including the circuit board electrode 6 is preferable, since it can detect more damages.

In each embodiment, the case of the damage might be described as a state in which the connection path is electrically completely fractured, i.e., as a state of "fracture". However, a state before the fracture and its change can be detected as the damage by measuring a capacitance or impedance as the electrical characteristic value.

The connection path allows electric current to flow through the measuring module 9, the wiring 10, the circuit board electrode 6, the electrical joint 4-2, the circuit board electrode 7, and the wiring 10 in this order. The electrical characteristic value includes an electric resistance value, current, and voltage.

Figure 1E:
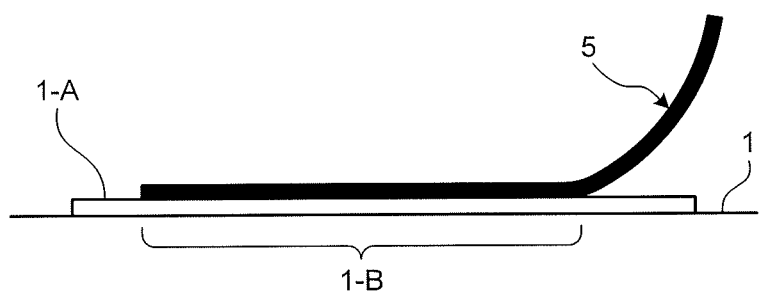
FIG. 1E is a view illustrating one example of a connection surface between a semiconductor element and a conductive member.

A great amount of heat is generated on the connection surface between the semiconductor device 1 and the conductive member 5 during when the electronic apparatus is used. As a result, a damage is likely to be caused on the electrical joint 4-2 (the electrical joint 4-2 closest to the connection surface) immediately under the connection surface. FIG. 1E is a view illustrating one example of the connection surface between the semiconductor device 1 and the conductive member 5. The surface on which an electrode 1-A formed on the semiconductor device 1 and the conductive member 5 are bonded corresponds to a connection surface 1-B.

The semiconductor device 1 has an amount of heat generation of about 10 W to 1 kW, for example. Therefore, the electrical joint 4-2 desirably has a function of dissipating heat in addition to a function of allowing current to flow therethrough. It is necessary to increase the connection area between the semiconductor device 1 and the electrical joint 4-2 in order to enhance the heat dissipation property (in order to attain a low thermal resistance). The connection area is preferably about 0.1 $cm^2$ to 10 $cm^2$, for example. A so-called heat flux acquired by dividing the above-mentioned amount of heat generation by the connection area is preferably within a range of 0.001 $kW/cm^2$ to 10 $kW/cm^2$, for example.

Accordingly, an aspect ratio of the electrical joint 4 is desirably set to 10 or more, more desirably 30 or more. The aspect ratio indicates a value of (a length of one side)/(height), or a value of (diameter)/(height). When the height of each of the electrical joints 4 is different, the minimum height is used as the "height". When the length of each side of the electrical joint 4 is different, the maximum length of the side is used as the "length of one side". When the diameter of each of the electrical joints 4 is different, the maximum diameter is used as the "diameter".

A void is likely to be generated around the electrical joint 4 due to a gap or resist between the electrodes. Therefore, when the damage caused immediately under the connection surface between the semiconductor device 1 and the conductive member 5 spreads, the voids produced on the electrical joint 4 formed between the electrodes become continuous, so that the circuit board electrode 6 and the electrical joint 4 are separated from each other. When current does not flow through a portion between the circuit board electrode 6 and the electrical joint 4 due to the separation, the electric resistance value increases, for example. With this, the damage of the electrical joint 4 can be sensed. If the shape of the circuit board electrode 6 is designed in order that the separation between the circuit board electrode 6 and the electrical joint 4 falls within a permissible range, the damage can be sensed before the electrical joint 4 is damaged fatally or damaged to a degree exceeding a permissible range.

According to the electronic apparatus thus designed according to the first embodiment, the fracture between the circuit board electrode and the electrical joint 4 can be sensed by measuring the electrical characteristic value by the measuring module 9, whereby the damage on the electrical joint 4 can preliminarily be detected.

Modification 1 of First Embodiment

Figure 2A:
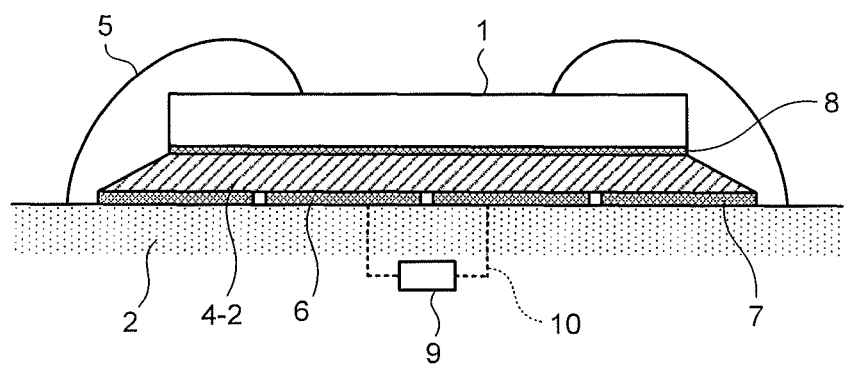
FIG. 2A is a sectional view illustrating an essential part of an electronic apparatus according to Modification 1 of the first embodiment.
Figure 2B:
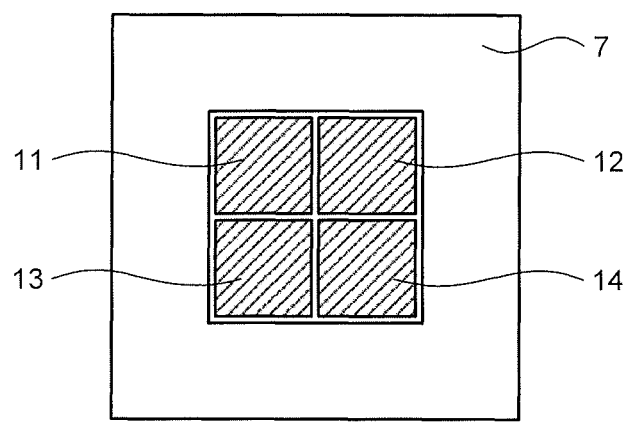
FIG. 2B is a view illustrating a shape of a circuit board electrode according to Modification 1 of the first embodiment.

Modification 1 of the first embodiment will next be described. FIG. 2A is a sectional view illustrating an essential part of an electronic apparatus according to Modification 1 of the first embodiment. FIG. 2B is a view illustrating a shape of a circuit board electrode in the electronic apparatus according to Modification 1 of the first embodiment. In this modification, only components different from those in the first embodiment will be described.

As illustrated in FIG. 2B, the shape of the circuit board electrode in the electronic apparatus according to this modification is different from that in the electronic apparatus according to the first embodiment. In the present modification, a circuit board electrode 6 includes a circuit board electrode 11, a circuit board electrode 12, a circuit board electrode 13, and a circuit board electrode 14, which are plural electrodes that are separated from one another. A gap may be formed between the electrodes, or a resist may be applied between the electrodes.

A portion between two of the circuit board electrodes 11 to 14 and the circuit board electrode 7 is electrically connected to a measuring module 9 via a wiring 10. For example, a portion between the circuit board electrode 11 and the circuit board electrode 12, or a portion between the circuit board electrode 13 and the circuit board electrode 14 are electrically connected to the measuring module 9, respectively. Between the circuit board electrode 11 and the circuit board electrode 12, current flows through the measuring module 9, the wiring 10, the circuit board electrode 11, the electrical joint 4-2, the circuit board electrode 12, and the wiring 10 in this order, whereby the electrical characteristic value is measured by the measuring module 9. Between the circuit board electrode 13 and the circuit board electrode 14, current flows through the measuring module 9, the wiring 10, the circuit board electrode 13, the electrical joint 4-2, the circuit board electrode 14, and the wiring 10 in this order, whereby the electrical characteristic value is measured by the measuring module 9.

The circuit board electrode 6 includes plural electrodes in this modification. Therefore, the present modification provides an effect of expediting the detection of the fracture. It may be configured such that each of the circuit board electrodes 11 to 14 includes the region immediately under the connection surface between the semiconductor device 1 and the conductive member 5. The electrical joint 4-2 immediately under the connection surface is easy to be damaged due to the heat on the connection surface. This configuration can expedite more the detection of the fracture.

Figure 2C:
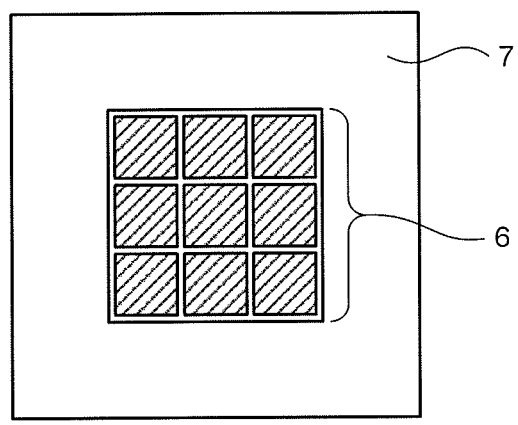
FIG. 2C is a view illustrating another example of the circuit board electrode according to Modification 1 of the first embodiment.

The more the number of the electrodes in the circuit board electrode 6 is, the more the precision of detecting the fracture can be enhanced. For example, the circuit board electrode includes 2×2 electrodes in FIG. 2B. However, the circuit board electrode may include 3×3 electrodes as illustrated in FIG. 2C. This configuration can enhance the precision.

Figure 2D:
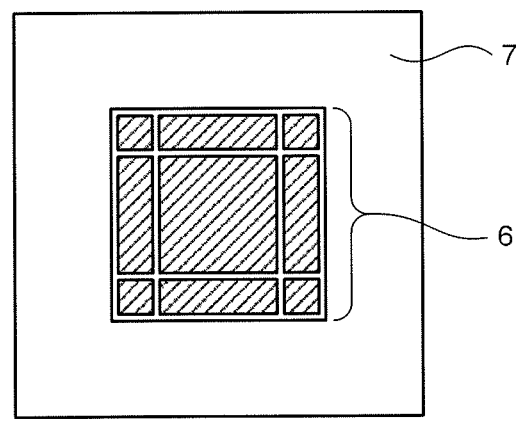
FIG. 2D is a view illustrating still another example of the circuit board electrode according to Modification 1 of the first embodiment.

The size of each electrode in the circuit board electrode 6 may be different from one another. This structure can detect a portion from which the fracture is to be detected more precisely. For example, in FIG. 2D, the circuit board electrode includes 3×3 electrodes, wherein the size of each of the electrodes is different at the central part and the peripheral part, compared to the circuit board electrode illustrated in FIG. 2C. Specifically, the size of the electrode on the portion from which the fracture is to be detected is decreased more than the size of the other electrodes, whereby the detection precision can be enhanced. In FIG. 2D, the detection precision of the fracture on the peripheral part can be enhanced more than the detection precision on the central part.

Modification 2 of First Embodiment

Figure 3A:
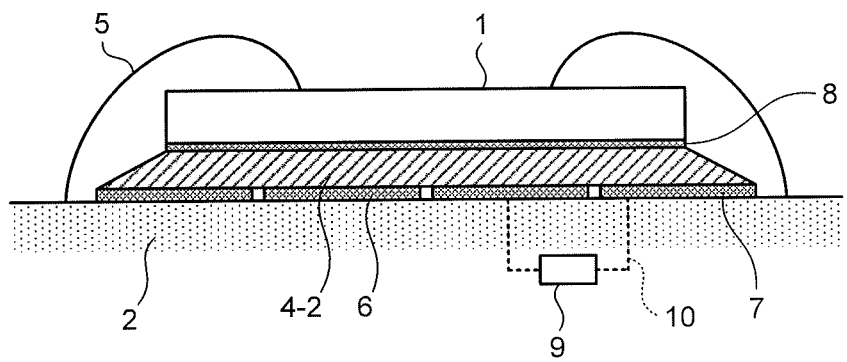
FIG. 3A is a sectional view illustrating an essential part of an electronic apparatus according to Modification 2 of the first embodiment.
Figure 3B:
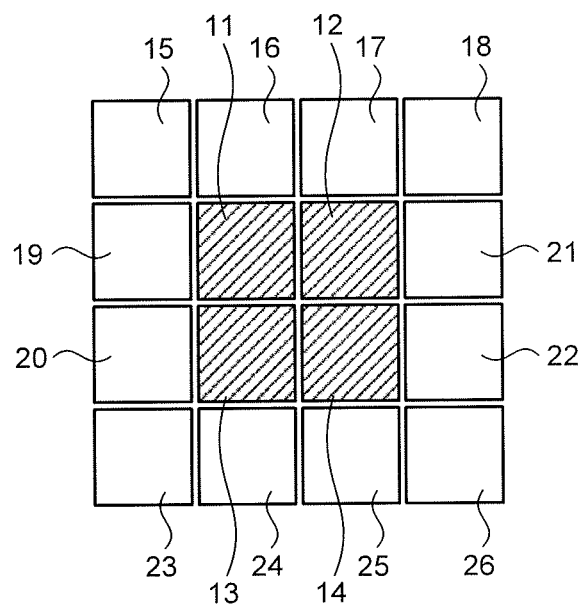
FIG. 3B is a view illustrating a shape of a circuit board electrode according to Modification 2 of the first embodiment.

Modification 2 of the first embodiment will next be described. FIG. 3A is a sectional view illustrating an essential part of an electronic apparatus according to Modification 2 of the first embodiment. FIG. 3B is a view illustrating a shape of a circuit board electrode in the electronic apparatus according to Modification 2 of the first embodiment. In this modification, only components different from those in Modification 1 of the first embodiment will be described.

As illustrated in FIG. 3B, the shape of the circuit board electrode in the electronic apparatus according to this modification is different from that in the electronic apparatus according to Modification 1 of the first embodiment. In the present modification, a circuit board electrode 7 in Modification 1 formed at the outside of a circuit board electrode 11, a circuit board electrode 12, a circuit board electrode 13, and a circuit board electrode 14 includes circuit board electrodes 15 to 26. A gap may be formed between the respective electrodes, or a resist may be applied between the respective electrodes.

A portion between two of the circuit board electrodes 11 to 26 is electrically connected to a measuring module 9 via a wiring 10. Between the circuit board electrode 11 and the circuit board electrode 16, current flows through the measuring module 9, the wiring 10, the circuit board electrode 11, the electrical joint 4-2, the circuit board electrode 16, and the wiring 10 in this order, whereby the electrical characteristic value is measured by the measuring module 9.

In the present modification, the circuit board electrode 7 includes plural electrodes. With this structure, not only an initial defect caused on the electrical joint 4-2 on the circuit board electrodes 11 to 14, and the damage on the electrical joint 4-2 caused by the generated heat on the connection surface between the semiconductor device 1 and the conductive member 5, but also an initial defect caused on the electrical joint 4-2 on the circuit board electrode 7, and the damage on the electrical joint 4-2 caused by a stress concentration on the corners of the electrical joint 4-2 can be detected at an early point.

Modification 3 of First Embodiment

Figure 4A:
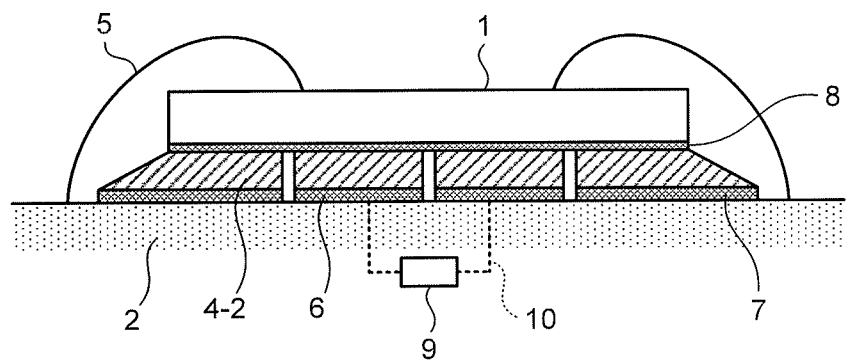
FIG. 4A is a sectional view illustrating an essential part of an electronic apparatus according to Modification 3 of the first embodiment.
Figure 4B:
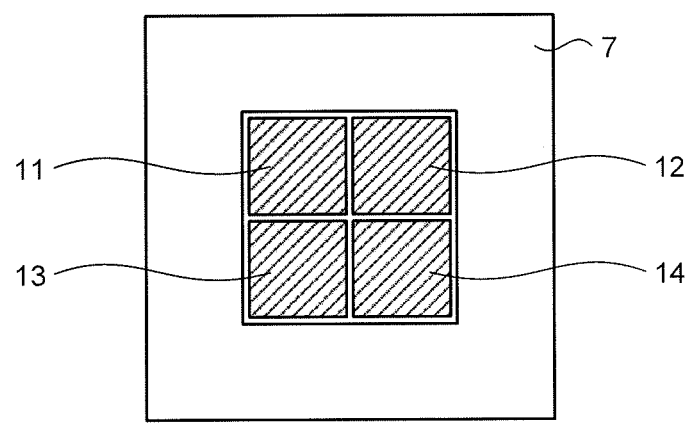
FIG. 4B is a view illustrating a shape of a circuit board electrode according to Modification 3 of the first embodiment.
Figure 4C:
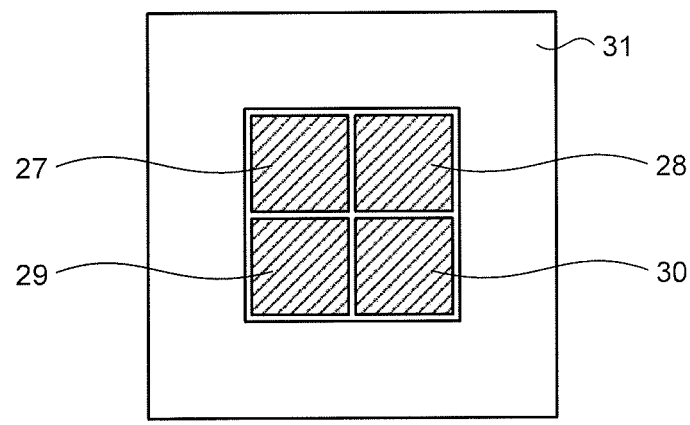
FIG. 4C is a view illustrating a shape of a electrical joint according to Modification 3 of the first embodiment.

Modification 3 of the first embodiment will next be described. FIG. 4A is a sectional view illustrating an essential part of an electronic apparatus according to Modification 3 of the first embodiment. FIG. 4B is a view illustrating a shape of a circuit board electrode in the electronic apparatus according to Modification 3 of the first embodiment. FIG. 4C is a view illustrating a shape of a electrical joint 4-2 in the electronic apparatus according to the modification 3 of the first embodiment. In this modification, only components different from those in the first embodiment will be described.

As illustrated in FIGS. 4A and 4C, the shape of the electrical joint 4-2 in the electronic apparatus according to this modification is different from that in the electronic apparatus according to the first embodiment. In the present modification, the electrical joint 4-2 includes electrical joints 27 to 31 that are separated from one another. The electrical joint 27 connects a circuit board electrode 11 and a device electrode 8. The electrical joint 28 connects a circuit board electrode 12 and a device electrode 8. The electrical joint 29 connects a circuit board electrode 13 and a device electrode 8. The electrical joint 30 connects a circuit board electrode 14 and a device electrode 8. The electrical joint 31 connects a circuit board electrode 7 and a device electrode 8.

A portion between two of the circuit board electrodes 11 to 14 and the circuit board electrode 7 is electrically connected to a measuring module 9 via a wiring 10. For example, a portion between the circuit board electrode 11 and the circuit board electrode 12, and a portion between the circuit board electrode 13 and the circuit board electrode 14 are electrically connected to the measuring module 9, respectively.

Between the circuit board electrode 11 and the circuit board electrode 12, current flows through the measuring module 9, the wiring 10, the circuit board electrode 11, the electrical joint 27, the device electrode 8, the electrical joint 28, the circuit board electrode 12, and the wiring 10 in this order, whereby the electrical characteristic value is measured by the measuring module 9. Between the circuit board electrode 13 and the circuit board electrode 14, current flows through the measuring module 9, the wiring 10, the circuit board electrode 13, the electrical joint 29, the device electrode 8, the electrical joint 30, the circuit board electrode 14, and the wiring 10 in this order, whereby the electrical characteristic value is measured by the measuring module 9.

When a large amount of heat is generated on the connection surface between the semiconductor device 1 and the conductive member 5, and hence, the damage caused on the electrical joint 4-2 immediately under the connection surface between the semiconductor device 1 and the conductive member 5 spreads during the use of the electronic apparatus, at least one of the electrical joints 27 to 30 is fractured. Due to the fracture of the electrical joint, current does not flow between the circuit board electrode 11 and the circuit board electrode 12, or between the circuit board electrode 13 and the circuit board electrode 14. Accordingly, the electric resistance value increases, whereby the damage on the electrical joint can be sensed.

In the present modification, the damage can precisely be sensed, regardless of the damaged portion on the electrical joint. Each of the electrical joints 27 to 30 may be configured to include the region immediately under the connection surface between the semiconductor device 1 and the conductive member 5. The electrical joint immediately under the connection surface is likely to be damaged because of the heat generated on the connection surface. The configuration described above can expedite the detection of the fracture.

Modification 4 of First Embodiment

Figure 5:
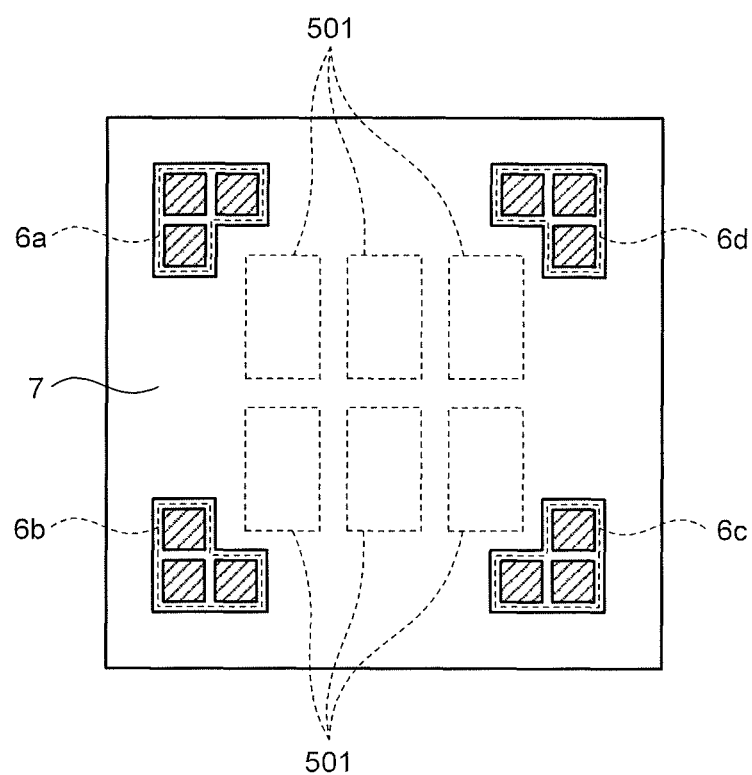
FIG. 5 is a view illustrating a shape of an electrode of an insulating circuit board according to Modification 4 of the first embodiment.

Modification 4 of the first embodiment will next be described. FIG. 5 is a sectional view illustrating a shape of an electrode near a device on an insulating circuit board in an electronic apparatus according to Modification 4 of the first embodiment. In this modification, only components different from those in Modification 1 of the first embodiment will be described.

As illustrated in FIG. 5, the shape of the electrode near the device on the insulating circuit board 2 in the electronic apparatus according to this modification is different from that in the electronic apparatus according to the first embodiment. A large amount of heat is generated on a connection surface between a semiconductor device 1 and a conductive member 5. Therefore, a region 501 in which a heat dissipation path has to be secured is formed in the vicinity of the portion immediately under the connection surface for bonding the conductive member 5 and the semiconductor device 1. In the present modification, four circuit board electrodes 6a to 6d are provided at the outside of the region 501.

In the present modification, the circuit board electrodes 6a to 6d are present at the outside of the region 501 in which the heat dissipation path has to be secured, thereby not hindering the heat dissipation. Since the circuit board electrodes 6a to 6d are adjacent to the region 501 in which the heat dissipation path has to be secured, the electrical joint 4-2 around the circuit board electrodes 6a to 6d is easy to be damaged. Therefore, the damage on the electrical joint 4-2 can be sensed at an early point by measuring the electrical characteristic value by the measuring module 9. In Modification 4, the electrical joint 4-2 may be configured by plural electrical joints that are separated from one another, as in Modification 3 of the first embodiment.

According to the electronic apparatus of the first embodiment, the damage can be sensed before the electrical joint is damaged fatally or damaged to a degree exceeding a permissible range.

Second Embodiment

Figure 6A:
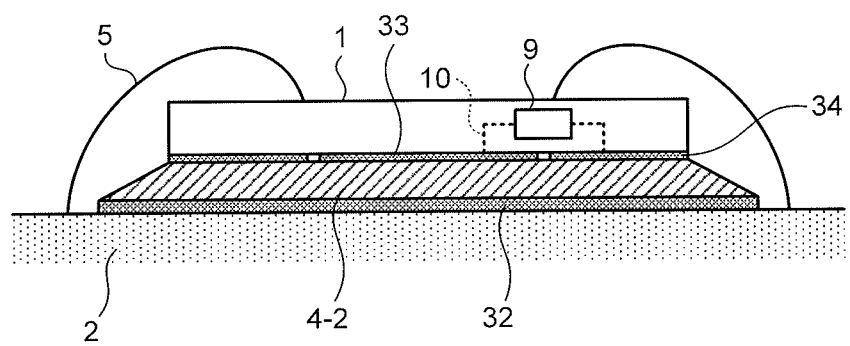
FIG. 6A is a sectional view illustrating an essential part of an electronic apparatus according to a second embodiment.
Figure 6B:
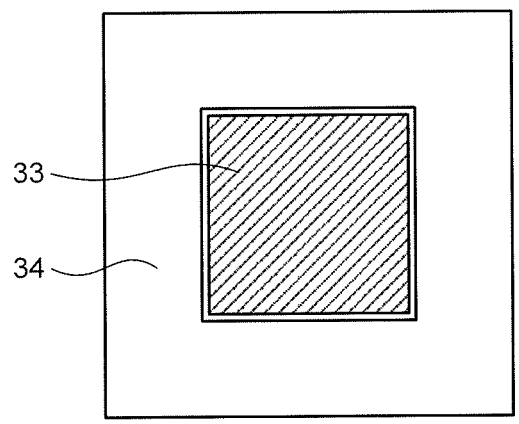
FIG. 6B is a view illustrating a shape of a device electrode according to the second embodiment.

A second embodiment will next be described. FIG. 6A is a sectional view illustrating an essential part of an electronic apparatus according to the second embodiment. FIG. 6B is a view illustrating a shape of a device electrode in the electronic apparatus according to the second embodiment. In this embodiment, only components different from those in the first embodiment will be described.

As illustrated in FIG. 6A, a circuit board electrode 32 is formed on the surface of an insulating circuit board 2. A device electrode 33 and a device electrode 34 are provided on the surface of a semiconductor device 1. The circuit board electrode 32, the device electrode 33, and the device electrode 34 are bonded to a electrical joint 4-2. As illustrated in FIG. 6B, the device electrode 33 is provided at the inside of the device electrode 34. Specifically, the device electrode 34 is provided on a region of the semiconductor device 1 around a region where the device electrode 33 is provided. A gap may be formed between the device electrode 33 and the device electrode 34, or a resist may be applied between the device electrode 33 and the device electrode 34.

The device electrode 33 and the device electrode 34 are electrically connected to a measuring module 9 via a wiring 10. The measuring module 9 measures an electrical characteristic value of a connection path including at least one of the device electrode 33 and the device electrode 34. The measuring module 9 is formed on the semiconductor device 1, for example. The connection path is formed such that current flows through the measuring module 9, the wiring 10, the device electrode 33, the electrical joint 4-2, the device electrode 34, and the wiring 10 in this order.

A great amount of heat is generated on the connection surface between the semiconductor device 1 and the conductive member 5 during when the electronic apparatus is used. As a result, a damage is likely to be caused on the electrical joint 4-2 (the electrical joint 4-2 closest to the connection surface) immediately under the connection surface. When the damage spreads, the device electrode 33 and the electrical joint 4-2 are separated from each other, so that current does not flow between the device electrode 33 and the electrical joint 4-2. Therefore, the electric resistance value increases, whereby the damage on the electrical joint 4-2 can be sensed. If the shape of the device electrode 33 is designed in order that the separation between the device electrode 33 and the electrical joint 4-2 falls within a permissible range, the damage can be sensed before the electrical joint 4-2 is damaged fatally or damaged to a degree exceeding a permissible range. In the second embodiment, the electrical joint 4-2 may be configured by plural electrical joints that are separated from one another, as in the modification 3 of the first embodiment.

Third Embodiment

Figure 7A:
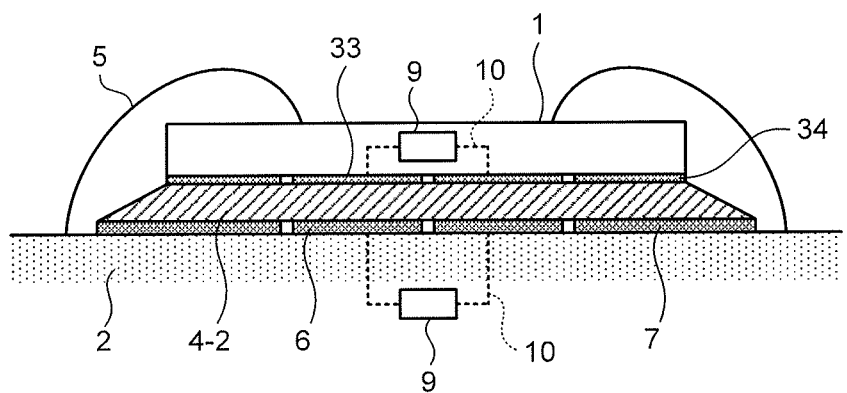
FIG. 7A is a sectional view illustrating an essential part of an electronic apparatus according to a third embodiment.
Figure 7B:
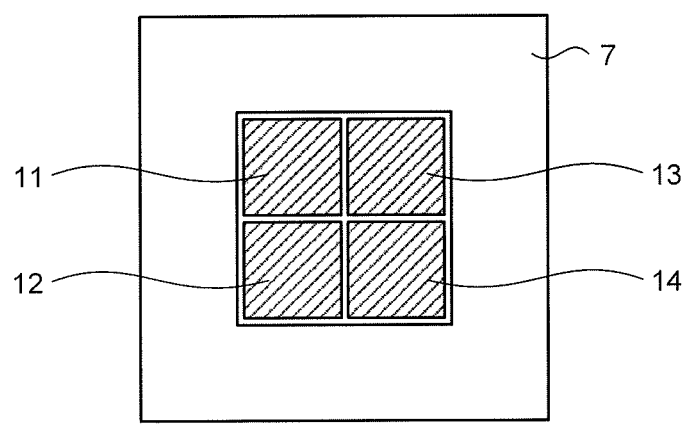
FIG. 7B is a view illustrating a shape of a circuit board electrode according to the third embodiment.
Figure 7C:
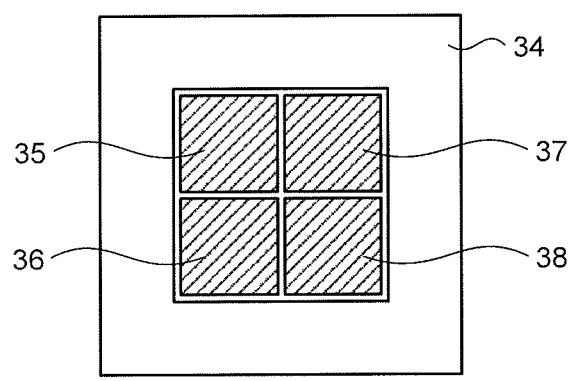
FIG. 7C is a view illustrating a shape of a device electrode according to the third embodiment.

A third embodiment will next be described. FIG. 7A is a sectional view illustrating an essential part of an electronic apparatus according to the third embodiment. FIG. 7B is a view illustrating a shape of a circuit board electrode according to the third embodiment. FIG. 7C is a view illustrating a shape of a device electrode according to the third embodiment. In this embodiment, only components different from those in the first embodiment will be described.

As illustrated in FIG. 7A, a circuit board electrode 6 and a circuit board electrode 7 are provided on the surface of an insulating circuit board 2. A device electrode 33 and a device electrode 34 are provided on a surface of a semiconductor device 1. The device electrode 33 and the device electrode 34 are bonded to the electrical joint 4-2.

As illustrated in FIG. 7A, the circuit board electrode 6 is provided at the inside of the circuit board electrode 7. The device electrode 33 is provided at the inside of the device electrode 34. As illustrated in FIG. 7B, the circuit board electrode 6 includes a circuit board electrode 11, a circuit board electrode 12, a circuit board electrode 13, and a circuit board electrode 14, which are separated from one another. As illustrated in FIG. 7C, the device electrode 33 includes a device electrode 35, a device electrode 36, a device electrode 37, and a device electrode 38, which are separated from one another. A gap may be formed between the electrodes, or a resist may be applied between the electrodes.

A portion between two of the circuit board electrodes 11 to 14 and the circuit board electrode 7 is electrically connected to a measuring module 9 via a wiring 10. For example, a portion between the circuit board electrode 11 and the circuit board electrode 12, or a portion between the circuit board electrode 13 and the circuit board electrode 14 are electrically connected to the measuring module 9, respectively.

Between the circuit board electrode 11 and the circuit board electrode 12, current flows through the measuring module 9, the wiring 10, the circuit board electrode 11, the electrical joint 4-2, the circuit board electrode 12, and the wiring 10 in this order, whereby the electrical characteristic value is measured by the measuring module 9. Between the circuit board electrode 13 and the circuit board electrode 14, current flows through the measuring module 9, the wiring 10, the circuit board electrode 13, the electrical joint 4-2, the circuit board electrode 14, and the wiring 10 in this order, whereby the electrical characteristic value is measured by the measuring module 9.

A portion between two of the device electrodes 35 to 38 and the device electrode 34 is electrically connected to the measuring module 9 via the wiring 10. For example, a portion between the device electrode 35 and the device electrode 36, or a portion between the device electrode 37 and the device electrode 38 are electrically connected to the measuring module 9, respectively.

Between the device electrode 35 and the device electrode 36, current flows through the measuring module 9, the wiring 10, the device electrode 35, the electrical joint 4-2, the device electrode 36, and the wiring 10 in this order, whereby the electrical characteristic value is measured by the measuring module 9. Between the device electrode 37 and the device electrode 38, current flows through the measuring module 9, the wiring 10, the device electrode 37, the electrical joint 4-2, the device electrode 38, and the wiring 10 in this order, whereby the electrical characteristic value is measured by the measuring module 9.

Modification 1 of Third Embodiment

Figure 7D:
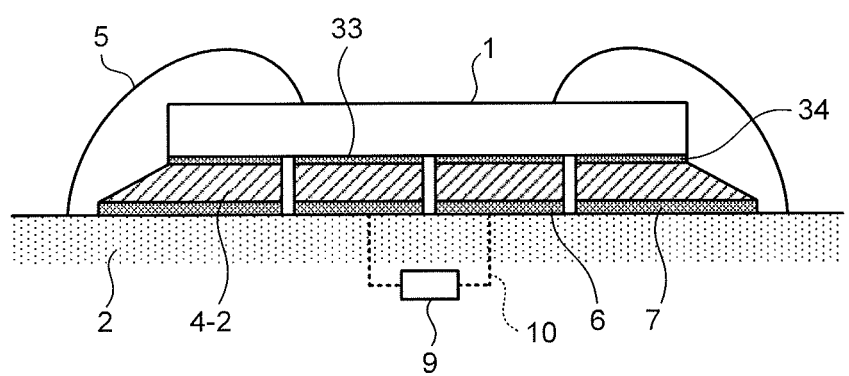
FIG. 7D is a sectional view illustrating an essential part of an electronic apparatus according to Modification 1 of the third embodiment.

In FIG. 7A, both of upper and lower electrodes of a electrical joint 4-2 are divided into plural electrodes. On the other hand, the electrical joint 4-2 may also be divided into plural portions. Specifically, as in Modification 3 of the first embodiment, the electrical joint 4-2 may be configured to include plural electrical joints that are separated from one another. FIG. 7D is a sectional view illustrating an essential part of an electronic apparatus according to Modification 1 of the third embodiment. The electrical joint 4-2 in this modification can be configured as illustrated in FIG. 4C.

FIG. 7E is a view illustrating one example of a connection path according to the present modification. FIG. 7E illustrates, from the left, the circuit board electrodes, the electrical joints, and device electrodes, which are superimposed in the order indicated by arrows. As illustrated in FIG. 7E, the divided electrodes and the divided electrical joints are connected by wirings 10A to 10E.

Specifically, the wiring 10A connects a measuring module 9 and a circuit board electrode 14. The wiring 10B connects a device electrode 37 and a device electrode 38. The wiring 10C connects a circuit board electrode 11 and a circuit board electrode 13. The wiring 10D connects a device electrode 35 and a device electrode 36. The wiring 10E connects a circuit board electrode 12 and the measuring module 9. This structure forms a connection path by which current flows through the measuring module 9, the circuit board electrode 14, the electrical joint 30, the device electrode 38, the device electrode 37, the electrical joint 28, the circuit board electrode 13, the circuit board electrode 11, the electrical joint 27, the device electrode 35, the device electrode 36, the electrical joint 29, the circuit board electrode 12, and the measuring module 9 in this order. The wirings illustrated in FIG. 7E are only an example, and the present invention is not limited thereto.

FIG. 7F is a view illustrating another example of the connection path in the present modification. FIG. 7F is different from FIG. 7E in that connection portions 10B-2 to 10D-2 are provided instead of the wirings 10B to 10D. As illustrated in FIG. 7F, at least some of the wirings may be replaced by the connection portions for connecting the adjacent electrodes. The connection portions to be replaced are not limited to those illustrated in FIG. 7F. For example, the connection portion may be provided on either one of the device electrode and the circuit board electrode.

According to the electronic apparatus according to the third embodiment, the damage, which is caused on any one of the electrical joint close to the semiconductor device 1 and the electrical joint close to the insulating circuit board 2, can precisely be sensed.

Fourth Embodiment

The first to third embodiments describe that the damage on the electrical joint between the semiconductor device 1 and the insulating circuit board 2 is sensed. These methods can also be applied to sense the damage on the electrical joint between the insulating circuit board 2 and the base plate 3. The fourth embodiment describes the example of the structure described above.

FIG. 8A is a sectional view schematically illustrating an entire electronic apparatus according to the fourth embodiment. In this embodiment, only components different from those in the first embodiment will be described.

As illustrated in FIG. 8A, a circuit board electrode 6-2 and a circuit board electrode 7-2 are provided on the surface of a base plate 3. A circuit board electrode 8-2 is provided on the surface of an insulating circuit board 2. The circuit board electrode 6-2, the circuit board electrode 7-2, and the circuit board electrode 8-2 are bonded to a electrical joint 4-1.

The lower view in FIG. 8A is a sectional view illustrating a portion under the circuit board electrode 6-2 and the circuit board electrode 7-2 of the device. As illustrated in this sectional view, the circuit board electrode 7-2 is formed on a region on the base plate 3 around a region where the circuit board electrode 6-2 is formed.

The circuit board electrode 6-2 and the circuit board electrode 7-2 are electrically connected to a measuring module 9 via a wiring 10. The measuring module 9 measures an electrical characteristic value of a connection path including at least one of the circuit board electrode 6-2 and the circuit board electrode 7-2.

A region 801 is a region under the semiconductor device 1. In this modification, the circuit board electrode 6 is provided at the outside of the region 801 where a heat dissipation path has to be secured. Therefore, the circuit board electrode 6-2 does not hinder the heat dissipation. As illustrated in the sectional view in FIG. 8A, the circuit board electrode 6-2 includes 32 electrodes, each of which has the same shape, and are arranged around the region 801 on a periphery of a rectangle.

Figure 8B:
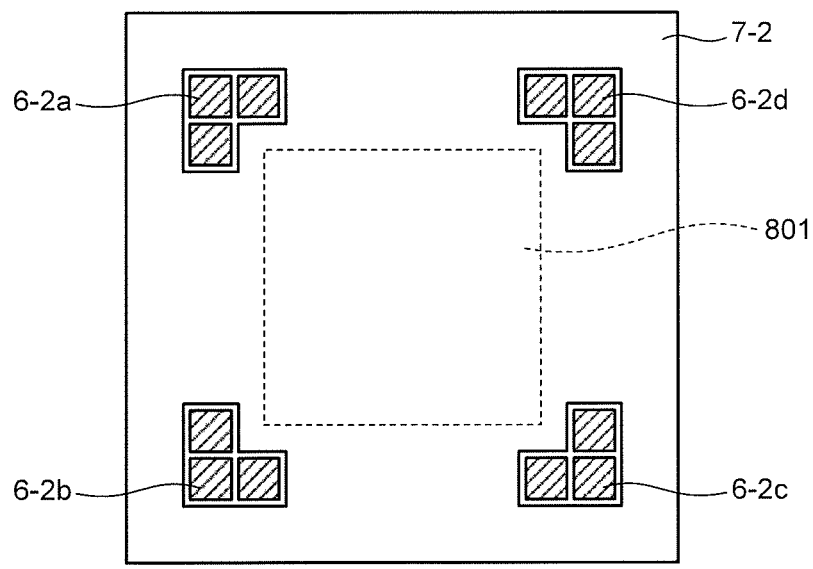
FIG. 8B is a sectional view illustrating a shape of a circuit board electrode formed on a base plate.

The shape of the circuit board electrode 6-2 is not limited to that illustrated in FIG. 8A. For example, instead of the circuit board electrode 6-2 in FIG. 8A, circuit board electrodes 6-2a to 6-2d illustrated in FIGS. 8B and 8C may be used.

Modification 1 of Fourth Embodiment

Modification 1 of the fourth embodiment will next be described. FIG. 9 is a sectional view illustrating an essential part of an electronic apparatus according to Modification 1 of the fourth embodiment. As illustrated in FIG. 9, the shape of the electrical joint 4-1 between the base plate 3 and the insulating circuit board 2 in the electronic apparatus according to the present modification is different from that in the electronic apparatus according to the fourth embodiment.

Specifically, as in Modification 3 of the first embodiment illustrated in FIG. 4A, the electrical joint 4-1 in the present modification includes plural electrical joints that are separated from one another.

Modification 2 of Fourth Embodiment

Figure 10B:
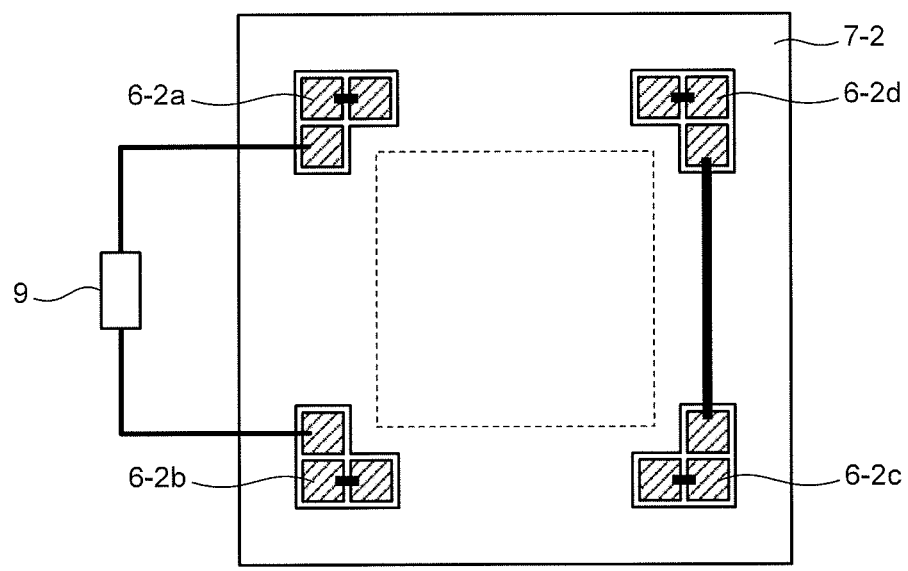
FIG. 10B is a view illustrating a shape of a circuit board electrode lower side of a electrical joint.
Figure 10C:
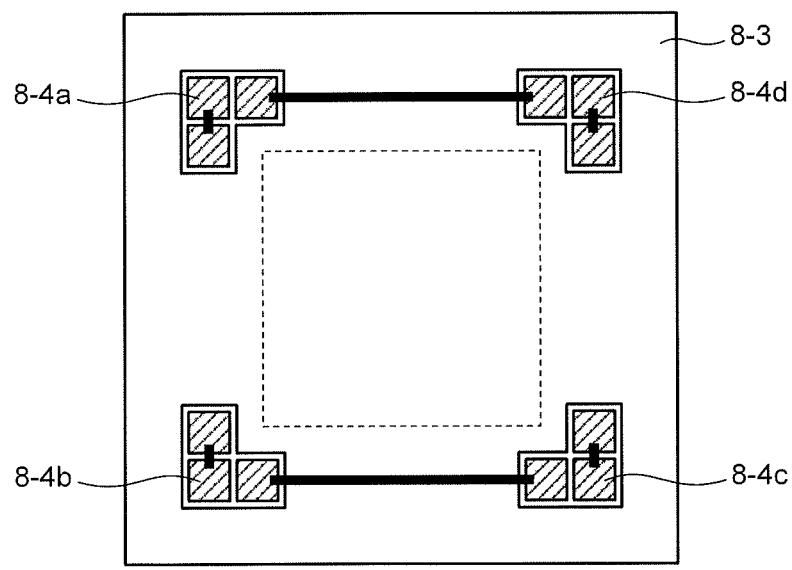
FIG. 10C is a view illustrating a shape of a circuit board electrode upper side of a electrical joint.

In FIG. 9, the electrical joint 4-1 and the electrode under the electrical joint 4-1 are divided into plural portions. However, the electrodes on the electrical joint 4-1 may also be divided into plural electrodes. FIG. 10A is a sectional view illustrating an essential part of an electronic apparatus according to Modification 2 of the forth embodiment. FIG. 10B is a view illustrating one example of a shape of the circuit board electrode lower side of the electrical joint 4-1. FIG. 10C is a view illustrating one example of a shape of the circuit board electrode upper side of the electrical joint 4-1.

FIG. 10B illustrates an example where the circuit board electrodes 6-2a to 6-2d, and the circuit board electrode 7-2 similar to those in FIG. 8B are employed. FIG. 10C illustrates an example where circuit board electrodes 8-4a to 8-4d, and 8-3, having the same shape as the circuit board electrodes 6-2a to 6-2d and the circuit board electrode 7 in FIG. 8B, are employed. Black solid lines in FIGS. 10B and 10C indicate examples of wirings connecting the electrodes.

Figure 10D:
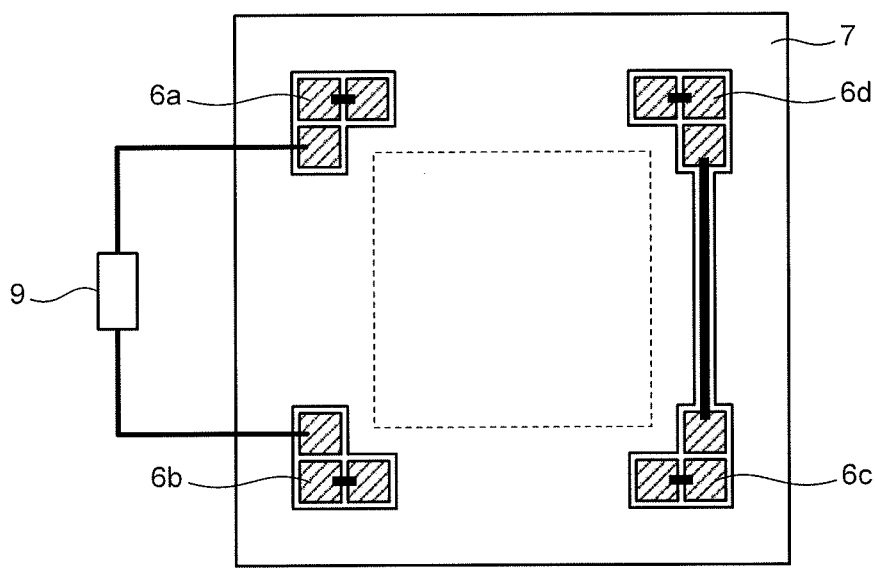
FIG. 10D is a view illustrating a circuit board electrode lower side of a electrical joint having a structure in which a connection portion is formed instead of a part of a wiring.
Figure 10E:
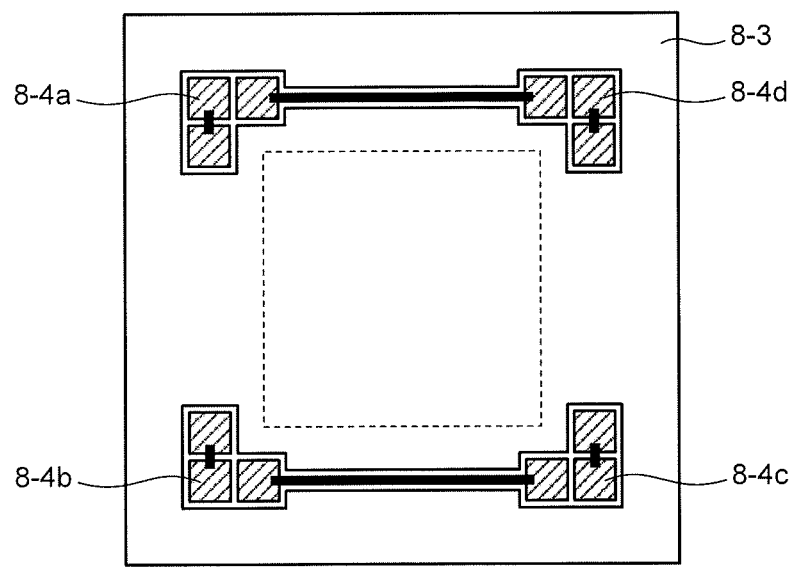
FIG. 10E is a view illustrating a circuit board electrode upper side of a electrical joint having a structure in which a connection portion is formed instead of a part of a wiring.

FIGS. 10D and 10E illustrate one example of a configuration provided with connection portions instead of some of the wirings in FIGS. 10B and 10C. Black solid lines in FIGS. 10D and 10E indicate examples of the connection portions connecting the electrodes. As described in FIG. 7F, the connection portions may be configured to be provided on either one of the upper and lower sides of the electrical joint 4-1.

Modification 3 of Fourth Embodiment

In FIG. 8A, the electrode on the lower side of the electrical joint 4-1, i.e., the electrode on the base plate 3, is divided (circuit board electrodes 6-2 and 7-2). As in the second embodiment, the electrode on the upper side of the electrical joint 4-1 may be divided. FIG. 10F is a sectional view illustrating an essential part of an electronic apparatus according to Modification 3 of the fourth embodiment thus configured. As illustrated in FIG. 10F, the electrode on the upper side of the base plate 3 is not divided in the present modification. A resist 1001 is applied on the surface of the electrode on the base plate 3. Thus, the electrical joint 4-1 is divided.

In the present modification, the connection path (not illustrated) is formed on the side where the electrode is divided, i.e., the upper side of the electrode on the electrical joint 4-1, and the electrical characteristic value of the connection path is measured.

Modification 4 of Fourth Embodiment

When the base plate 3 is made of copper, an electrode for solder bonding might be unnecessary. Modification 4 of the fourth embodiment describes a case where the electrode is not formed on the base plate 3. FIG. 10G is a sectional view illustrating an essential part of an electronic apparatus according to Modification 4 of the fourth embodiment. As illustrated in FIG. 10G, an electrode is not formed on the base plate 3 according to the present modification. A resist 1011 is applied on the surface of the base plate 3. Thus, the electrical joint 4-1 is divided.

As in Modification 3 of the fourth embodiment, the connection path is formed on the electrode on the upper side of the electrical joint 4-1, and the electrical characteristic value of the connection path is measured according to the present modification.

Fifth Embodiment

A fifth embodiment will next be described. FIG. 11 is a sectional view illustrating an essential part of an electronic apparatus according to the fifth embodiment. As illustrated in FIG. 11, a circuit board electrode 32-2 is provided on the surface of a base plate 3. A circuit board electrode 33-2 and a circuit board electrode 34-2 are provided on the surface of an insulating circuit board 2. The circuit board electrode 32-2, the circuit board electrode 33-2, and the circuit board electrode 34-2 are bonded to a electrical joint 4-1. Specifically, in the fifth embodiment, not the electrode (circuit board electrode 32-2) on the lower side of the electrical joint 4-1 but the electrode (circuit board electrode 33-2, the circuit board electrode 34-2) on the upper side of the electrical joint 4-1 is separated, as in the second embodiment illustrated in FIG. 6A.

Although not illustrated in FIG. 11, the circuit board electrode 33-2 and the circuit board electrode 34-2 are electrically connected to a measuring module 9 via a wiring 10. Thus, the separation between the circuit board electrode 33-2 and the electrical joint 4-1 can be detected in the same manner as in the second embodiment.

In the fifth embodiment, the electrical joint 4-1 may be configured by plural electrical joints that are separated from one another, as in Modification 3 of the first embodiment.

Sixth Embodiment

Figure 12C:
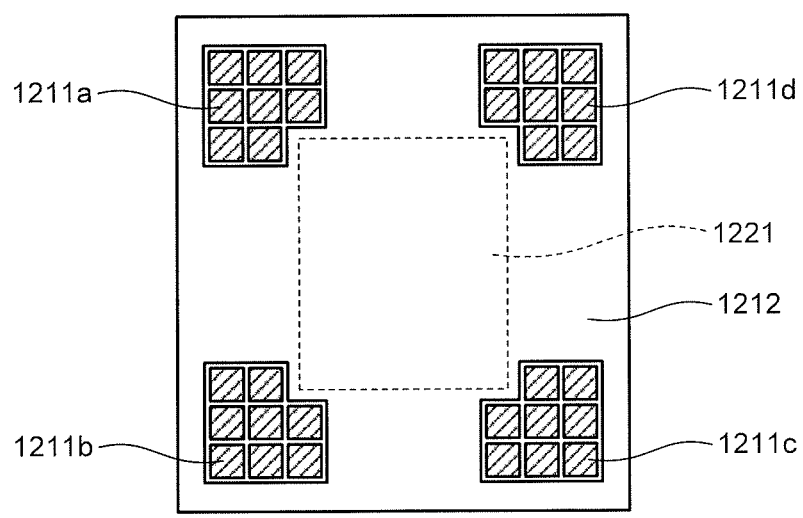
FIG. 12C is a view illustrating a shape of an electrode on a semiconductor device according to the sixth embodiment.

A sixth embodiment will next be described. FIG. 12A is a sectional view schematically illustrating an entire electronic apparatus according to the sixth embodiment. FIG. 12B is a sectional view illustrating an essential part of the electronic apparatus according to the sixth embodiment. FIG. 12C is a view illustrating a shape of an electrode formed on a semiconductor device 1 according to the sixth embodiment. In this embodiment, only components different from those in the first embodiment will be described.

In the present embodiment, the conductive member 5 is made of a metal plate, for example. The material of the conductive member 5 is copper, for example. An electrode on the device is formed on the surface of the semiconductor device 1. As illustrated in FIG. 12C, the electrode on the device includes electrodes 1211a to 1211d, and an electrode 1212. When it is unnecessary to distinguish these electrodes, the electrodes 1211a to 1211d are merely referred to as an electrode 1211.

Figure 8C:
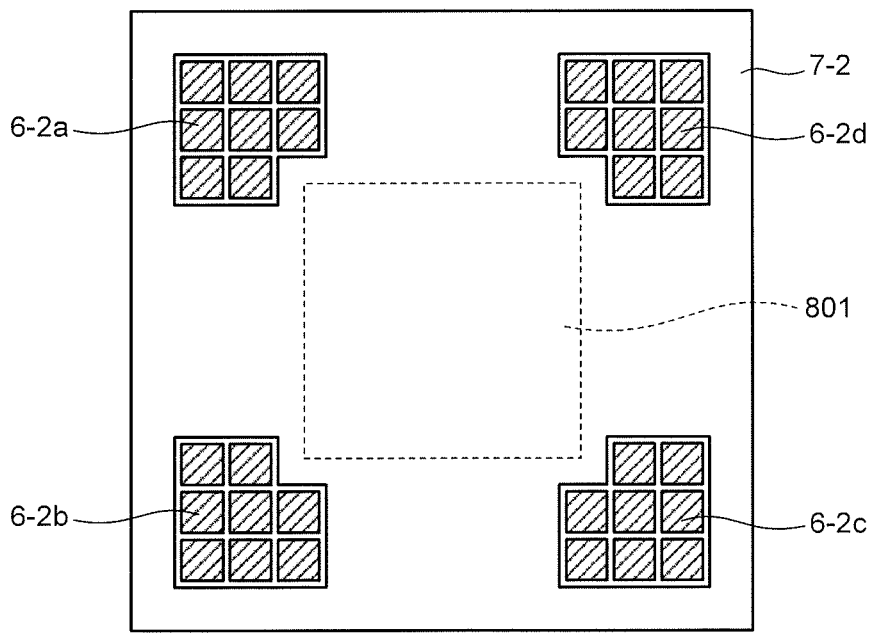
FIG. 8C is a sectional view illustrating the shape of the circuit board electrode formed on the base plate.

FIG. 12C illustrates that the electrode 1211 and the electrode 1212 have the configurations same as the configurations of the circuit board electrodes 6-2a to 6-2d and the circuit board electrode 7-2 illustrated in FIG. 8C. The electrode 1211 and the electrode 1212 may have the shape same as those of the circuit board electrode 6-2 and the circuit board electrode 7-2 illustrated in FIGS. 8A and 8B.

As illustrated in FIGS. 12A and 12B, the electrode 1211 and the electrode 1212 are connected with the conductive member and a electrical joint 4-3. As illustrated in FIG. 12C, the electrode 1211 is formed at the inside of the electrode 1212. The electrode 1211 includes plural electrodes that are separated from one another. A gap may be formed between the electrodes, or a resist may be applied between the electrodes. A region 1221 where a heat dissipation path has to be secured is formed immediately under the connection surface of the conductive member 5. The electrode 1211 is located at the outside of the region 1221.

As illustrated in FIG. 12B, in the present embodiment, the plural electrodes composing the electrode 1211 are connected to a measuring module 9. Thus, the damage on the electrical joint 4-3 for bonding the semiconductor device 1 and the conductive member 5 can be sensed. Since the electrode 1211 is provided at the outside of the region 1221 in which the heat dissipation path has to be secured, the electrode 1211 does not hinder the heat dissipation. Since the electrode 1211 is adjacent to the region 1221, the damage on the electrical joint 4-3 (the electrical joint 4-3 that is easy to be damaged) around the region 1221 can be sensed at an early point.

Figure 13:
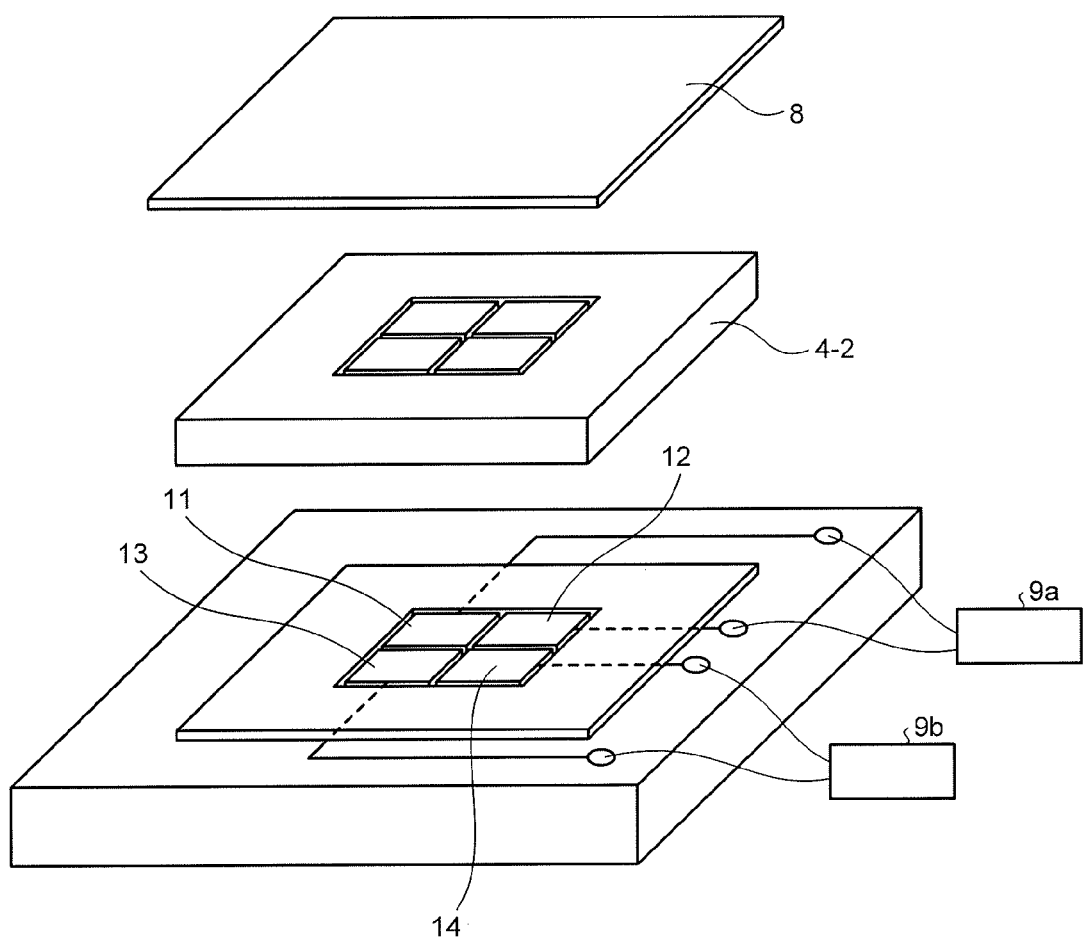
FIG. 13 is a view illustrating a wiring when two measuring units are used.

In each of the above-mentioned embodiments, the electrical characteristic value is measured by using one measuring module 9. However, the number of the measuring module 9 is not limited to one. Plural measuring modules 9 may be employed. FIG. 13 illustrates an example of wirings in a case in which two measuring modules 9a and 9b are used. In the example in FIG. 13, the circuit board electrode 11 and the circuit board electrode 12 are connected to the measuring module 9a, while the circuit board electrode 13 and the circuit board electrode 14 are connected to the measuring module 9b.

Figure 14A:
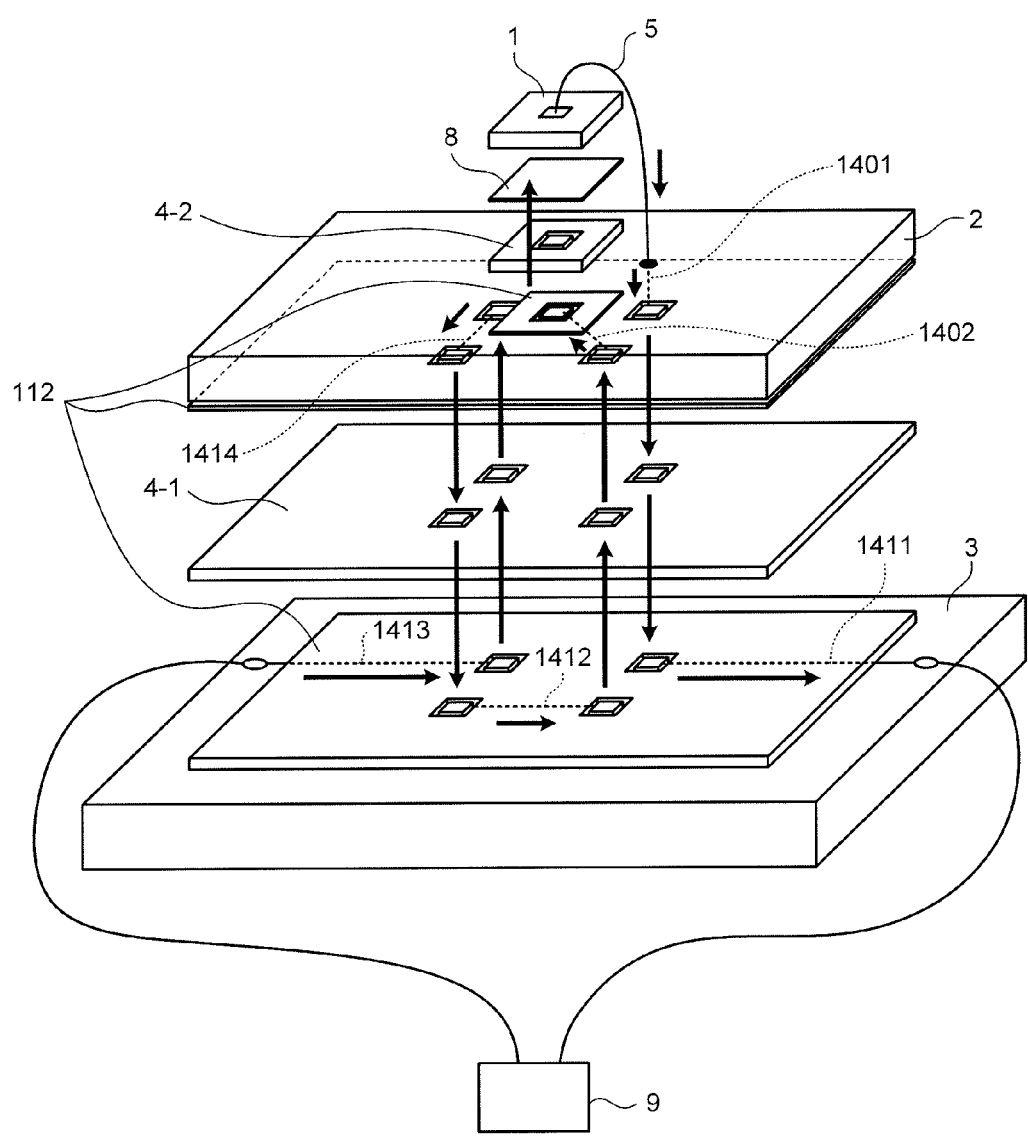
FIG. 14A is a view illustrating a wiring when one measuring module is used.

FIG. 14A is a view illustrating another example of wirings in a case where only one measuring module 9 is used for plural targets to be sensed.

A wiring 1401 and a wiring 1402 are wirings connecting the electrodes on the surface and the back surface of the insulating circuit board 2. The wirings 1401 and 1402 pass through the insulating circuit board 2. More specifically, the wiring 1401 connects the connection portion of the conductive member 5 on the surface (near the semiconductor device 1) of the insulating circuit board 2, and electrodes 112 on the back surface (near the base plate 3) of the insulating circuit board 2. The wiring 1402 connects the electrode 112 at the inside of the surface of the insulating circuit board 2 and the electrode 112 on the back surface of the insulating circuit board 2.

Wirings 1411 to 1414 are wirings connecting the electrodes on the surface of the insulating circuit board 2 or the base plate 3. For example, the wiring 1414 connects two of the electrodes 112 on the back surface of the insulating circuit board 2.

Figure 14B:
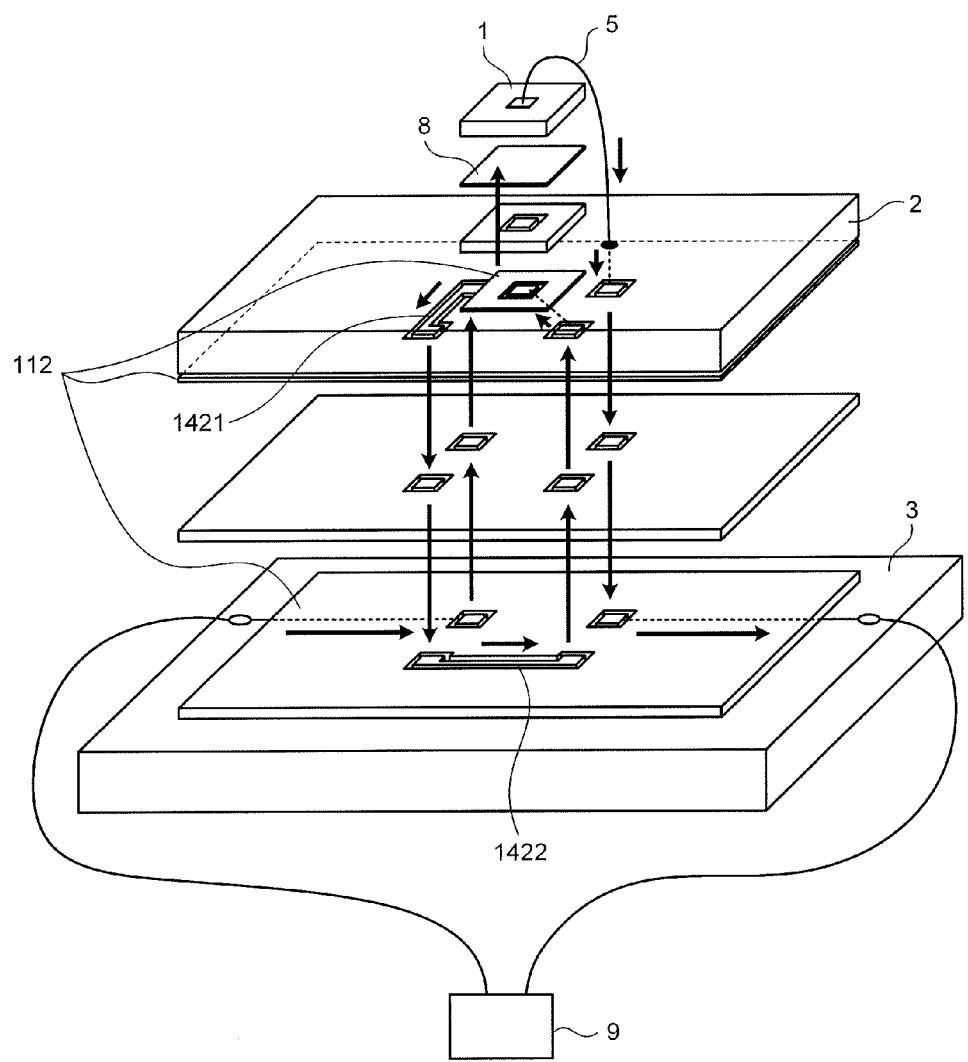
FIG. 14B is a view illustrating another example of a wiring when one measuring module is used.

FIG. 14B is a view illustrating another example of wirings in the case where only one measuring module 9 is used for plural targets to be sensed. FIG. 14B illustrates that connection portions 1421 and 1422 are provided instead of the wirings 1414 and 1412. In other words, some of the wirings may be replaced by the connection portions for connecting the electrodes.

According to the configurations illustrated in FIGS. 14A and 14B, the measuring module 9 can sense the fracture caused on any one of the electrical joint 4-2 under the semiconductor device 1, the electrical joint 4-1 under the insulating circuit board 2, the connection portion of the conductive member 5, and the conductive member 5.

Even in this case, the measuring module 9 is not limited to only one. Plural measuring modules 9 may be employed. The numbers of the semiconductor device 1, the insulating circuit board 2, the base plate 3, and the conductive member 5 are not limited to one. Plural semiconductor devices 1, plural insulating circuit boards 2, plural base plates 3, and plural conductive members 5 may be employed.

Figure 15A:
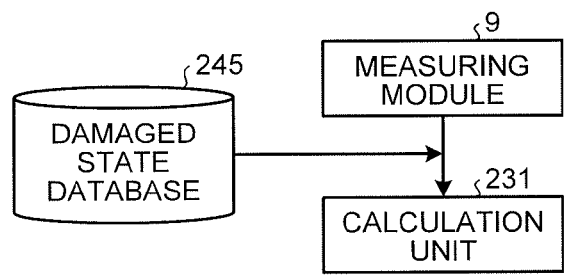
FIG. 15A is a block diagram illustrating an example of a schematic configuration a monitoring apparatus.

Subsequently, one example of a predicting process for predicting a damaged state of the electrical joint from the electrical characteristic value measured by the measuring module 9 will be described. FIG. 15A is a block diagram illustrating an example of a schematic configuration of a monitoring apparatus that predicts the damaged state of the electrical joint. As illustrated in FIG. 15A, the monitoring apparatus includes the measuring module 9, a calculation unit 231, and a damaged state database 245.

The calculation unit 231 refers to the electrical characteristic value of the connection path measured by the measuring module 9, and the information stored in the damaged state database 245, thereby predicting the damaged state of the electrical joint. The damaged state database 245 stores information indicating the damaged state of the electrical joint when the electrical characteristic value $x_i$ is outside a specified range, for example. The calculation unit 231 may be configured by hardware, or may be configured by a program module.

Figure 15B:
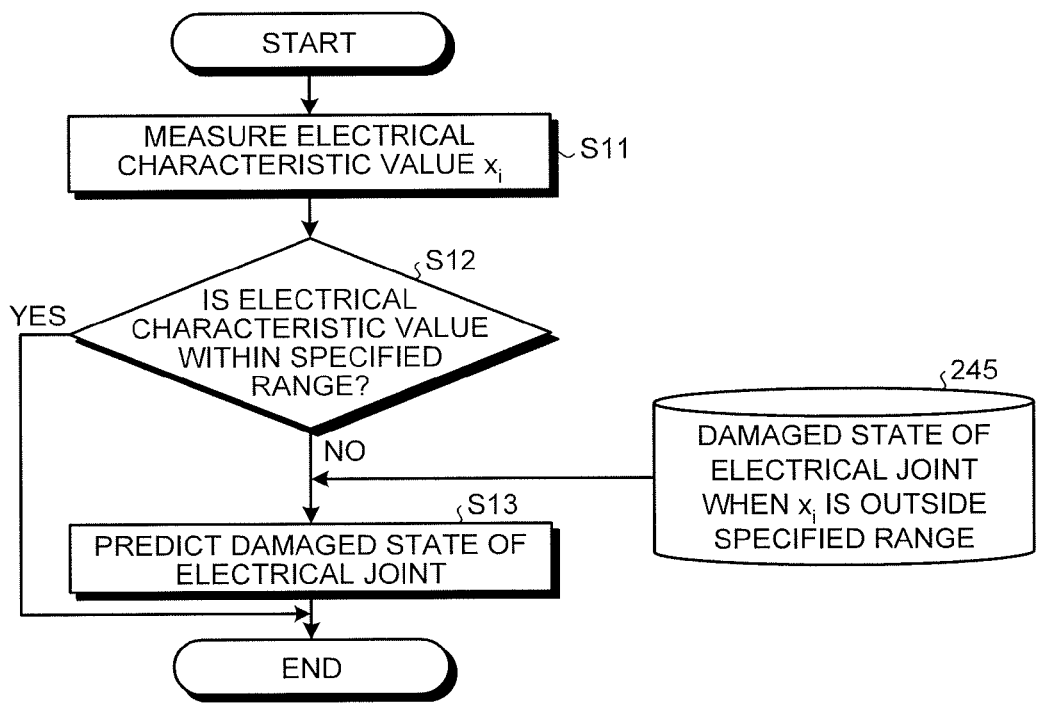
FIG. 15B is a flowchart of a predicting process.

FIG. 15B is a flowchart illustrating one example of a flow of the predicting process. Firstly, the measuring module 9 measures the electrical characteristic value $x_i$ (step S11). The electrical characteristic value $x_i$ indicates the electrical characteristic value measured by the ith measuring module 9 out of n (n is 1 or more integer) measuring modules 9. The calculation unit 231 determines whether the measured electrical characteristic value $x_i$ falls within the specified range or not (step S12).

When the electrical characteristic value $x_i$ falls within the specified range (step S12: Yes), the predicting process is ended. When the electrical characteristic value $x_i$ does not fall within the specified range (step S12: No), the calculation unit 231 refers to the information stored in the damaged state database 245 to predict the damaged state of the electrical joint (step S13). The calculation unit 231 predicts the damaged state by referring to this information.

FIG. 16 is a flowchart illustrating another example of the flow of the predicting process. It is supposed that the prediction of the damaged state of the electrical joint is defined as the prediction of the number of life cycles till the electrical joint is fractured, for example. In FIG. 16, the number of the measured electrical characteristic values is defined as n, and the ith electrical characteristic value is defined as $x_i$. A variable that assumes 0 when the electrical characteristic value $x_i$ falls within the specified range, while assumes 1 when the electrical characteristic value $x_i$ does not fall within the specified range is defined as $y_i$. The number of the electrical characteristic values that are outside the specified range is defined as k. The initial values for k and $y_i$ are set to 0. The initial value for i is set to 1.

It may be configured such that each of one or more measuring modules 9 measures one electrical characteristic value, or such that some of one or more measuring modules 9 measures plural electric properties. The case where one measuring module 9 measures the plural electric properties includes a case where one measuring module 9 detects the electrical characteristic value of plural electrical joints (electrical joints on plural locations), and a case where one measuring module 9 measures plural electrical characteristic values (capacitance, impedance, electric resistance value, etc.).

Firstly, the calculation unit 231 determines whether $y_i$ is equal to 0 or not (step S21). When it is equal to 0 (step S21: Yes), the calculation unit 231 measures the ith electrical characteristic value $x_i$ (step S22). The calculation unit 231 determines whether the measured electrical characteristic value $x_i$ falls within the specified range or not (step S23).

When the electrical characteristic value $x_i$ does not fall within the specified range (step S23: No), the calculation unit 231 increments k by 1, and updates $y_i$ to 1 (step S24). The calculation unit 231 refers to the information stored in the damaged state database 245 so as to set $N'_{fi}$ to a predicted life $N_{fk}$ (step S25). The $N'_{fi}$ indicates the predicted life of the electrical joint corresponding to the case where the electrical characteristic value $x_i$ measured by the ith measuring module 9 is outside the specified range. A storage unit stores $N'_{f1}$ to $N'_{fn}$, each of which is the predicted life of the electrical joint corresponding to the first to n-th measuring modules 9. The predicted life $N_{fk}$ indicates the predicted life of the electrical joint corresponding to the k-th measuring module 9 that the electrical characteristic value becomes outside the specified range. The predicted life corresponds to the prediction of the number of life cycles till the electrical joint is fractured.

When $y_i$ is not equal to 0 (step S21: No), or when the electrical characteristic value $x_i$ falls within the specified range (step S23: Yes) after step S25, the calculation unit 231 increments i by 1 (step S26). The calculation unit 231 determines whether i is larger than n or not (step S27). When it is not larger (step S27: No), the calculation unit 231 returns to step S21 to repeat the process.

When i is larger than n (step S27: Yes), the calculation unit 231 determines whether k is equal to 0 or not (step S28). When it is not equal to 0 (step S28: No), the calculation unit 231 sets the minimum value of the predicted lives $N_{f1}$ to $N_{fk}$ as $N_f$ (step S29). For example, an output unit for outputting the $N_f$ as the predicted life of the electronic apparatus may be provided. When k is equal to 0 (step S28: Yes), the calculation unit 231 ends the predicting process.

In the present embodiment, every time the electrical characteristic value becomes outside the specified range, the prediction of the damaged state is corrected in a stepwise manner.

Seventh Embodiment

Figure 17:
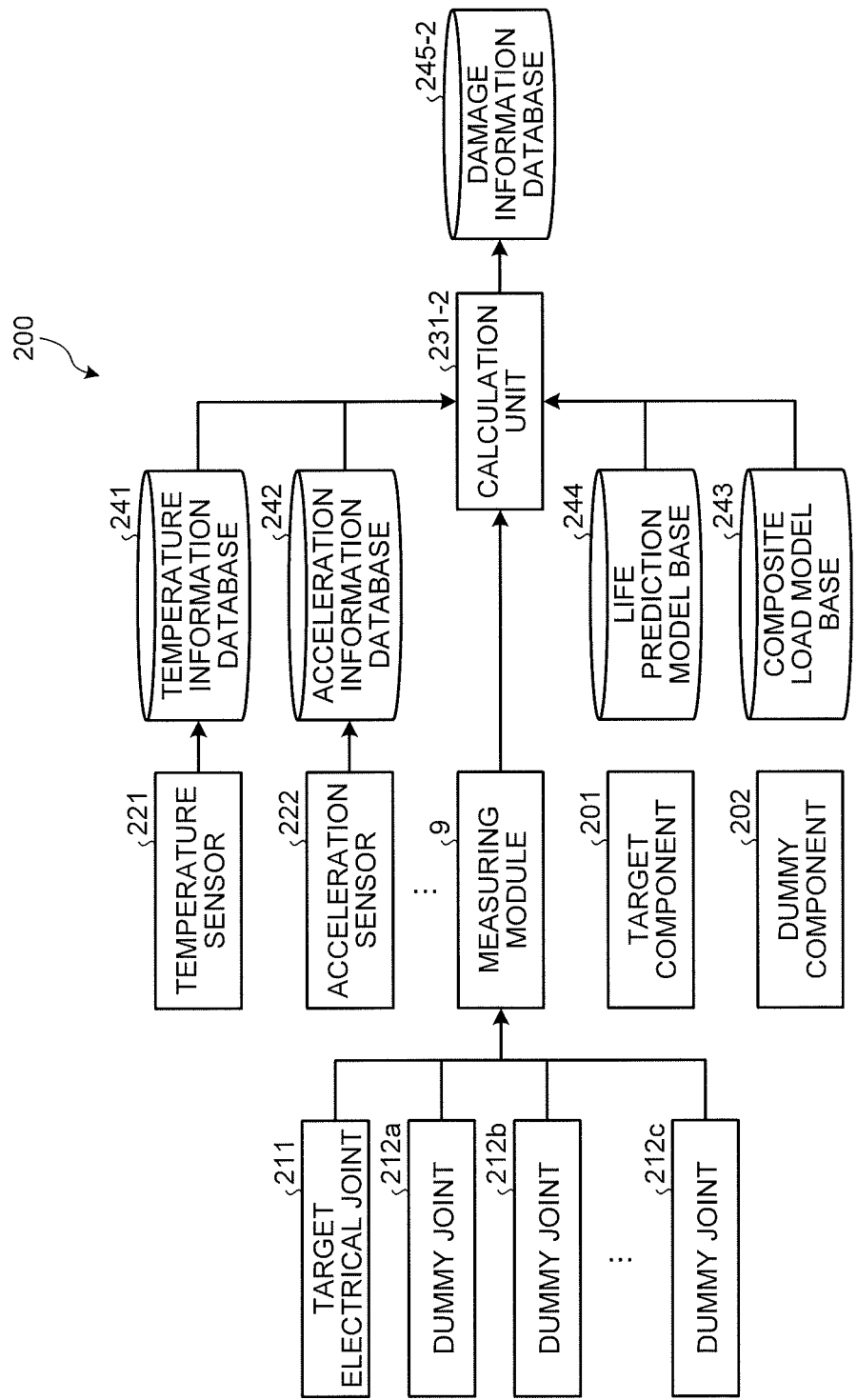
FIG. 17 is a block diagram illustrating a monitoring apparatus according to a seventh embodiment.

Subsequently, an example of a configuration of a monitoring apparatus for predicting the damaged state of the electrical joint will be described. FIG. 17 is a block diagram illustrating an example of a schematic configuration of a monitoring apparatus 200 according to the seventh embodiment.

The monitoring apparatus 200 includes a circuit board (not illustrated) on which a target component 201 and a dummy component 202 are mounted. The target component 201 may include the semiconductor device 1, for example. This circuit board is installed in an electronic apparatus, such as power electronics device, in-vehicle electronic apparatus, or medical device. The target component 201 is connected to the circuit board via a target electrical joint 211. The target component 201 or the dummy component 202 is connected to the circuit board through one or plural dummy joints 212a to 212c.

The target electrical joint 211 means a electrical joint whose life or damage is to be predicted. The dummy joints 212a to 212c are electrical joints that form a connection path connected to the measuring module sensing the fracture, and they are the electrical joints other than the target electrical joint 211. Any one of the electrical joints, in the first to sixth embodiments, forming the connection path connected to the measuring module sensing the fracture can be applied to a dummy joint 212, for example. Unless otherwise specified, the dummy joints 212a to 212c are merely referred to as the dummy joint 212. The target component 201 indicates a component to which the target electrical joint 211 is connected. The dummy component 202 indicates the components other than the target component 201.

The dummy joint 212 is placed on a portion where it is highly possibly fractured before the target electrical joint 211 is fractured according to the temperature variation and acceleration variation. Specifically, the dummy ejoint 212 is placed on the location where the life of the dummy joint 212 becomes shorter than the life of the target electrical joint 211 to the thermal load and dynamic load. The target electrical joint 211 and the dummy joint 212 are made by a thin-film soldering electrical joint, for example. The target electrical joint 211 and the dummy joint 212 are not limited thereto, but may be a wire electrical joint of the device electrode or a metal thin-film bonding layer. The target component 201 and the dummy component 202 may be the same, or may be different from each other.

The monitoring apparatus 200 also includes the measuring module 9, a temperature sensor 221, an acceleration sensor 222, a calculation unit 231-2, a temperature information database 241, an acceleration information database 242, a composite load model base 243, a life prediction model base 244, and a damage information database 245-2, in addition to the target component 201, the target electrical joint 211, the dummy component 202, and the dummy joint 212.

The calculation unit 231-2 includes a reading unit (not illustrated) that reads data or a model from each database and each model base.

The calculation unit 231-2 and the measuring module 9 may be configured by hardware or may be configured by a program module. When they are configured by the program module, each program module is stored in a recording medium such as a non-volatile memory or a hard disk, read from the recording medium by a computer such as a CPU, and executed as being developed on a memory device such as a RAM, or directly executed. The database or model base can be configured by a recording medium such as a memory device, hard disk, CD-ROM, or USB memory.

The temperature information database 241 records a variation history of the temperature detected by the temperature sensor 221 as temperature history data. The acceleration information database 242 records a variation history of the acceleration detected by the acceleration sensor 222 as acceleration history data.

For example, the temperature information database 241 and the acceleration information database 242 may record the temperature information or acceleration information at a fixed time interval, or may record the temperature information or acceleration information at a timing designated beforehand (e.g., at a timing when the temperature becomes a designated temperature, or at a timing when the acceleration becomes a designated acceleration). When it is recorded, time information may be added to the temperature information and the acceleration information.

The measuring module 9 measures the electrical characteristic value (e.g., resistance value) of the target electrical joint 211 and the dummy joint 212, and notifies the resultant to the calculation unit 231-2. When the electrical characteristic value (resistance value) is not less than a threshold value, the calculation unit 231-2 determines that the target electrical joint 211 is fractured.

The calculation unit 231-2 estimates a life distribution of the target electrical joint 211 (estimates whether the target electrical joint 211 reaches the end of its life, or estimates how long the remaining life of the target electrical joint 211 is) and estimates a failure probability of the target electrical joint 211 in accordance with the various databases and model bases based upon the temperature history data and the acceleration history data recorded in the temperature information database 241 and the acceleration information database 242. Specifically, the calculation unit 231-2 acquires a damage value (here, a temperature damage value and acceleration damage value indicating a cumulative load caused by the temperature variation and acceleration variation) of the target electrical joint 211 based upon the temperature history data and the acceleration history data. When the acquired damage value reaches a threshold value, the calculation unit 231-2 determines that the target electrical joint 211 reaches the end of its life, and takes a predetermined action. For example, the calculation unit 231-2 informs a user of the situation that the target electrical joint 211 reaches the end of its life through an output unit (not illustrated) serving as an interface to the outside.

The calculation unit 231-2 also determines whether the target electrical joint 211 and the dummy joint 212 are fractured (fails to operate properly) or not based upon the electrical characteristic value of the target electrical joint 211 and the dummy joint 212 reported from the measuring module 9. When the calculation unit 231-2 detects the failure of the target electrical joint 211, it takes a predetermined action through the above-mentioned output unit.

On the other hand, when the calculation unit 231-2 detects the failure of the dummy joint 212, it calculates a damage value (the temperature damage value and acceleration damage value) of the dummy joint 212 by utilizing the database and the model base based upon sensing history (the temperature history data and acceleration history data) in the temperature information database 241 and the acceleration information database 242. The calculation unit 231-2 reflects the calculated damage value on the estimation of the life distribution and the estimation of the failure probability of the target electrical joint 211 so as to calibrate (correct) the estimation of the life distribution and the estimation of the failure probability of the target electrical joint 211. The life distribution is a probability distribution with the life being used as a variable. The failure probability can be calculated from a probability distribution expressing the life distribution, or from a probability distribution using the damage value as a variable, as the probability that the target electrical joint 211 is fractured before reaching the end of the prescribed life.

The detailed operation of the calculation unit 231-2 will be described later. The composite load model base 243 and the life prediction model base 244 used for the calculation by the calculation unit 231-2 will be described below.

The life prediction model base 244 will firstly be described.

The life prediction model base 244 stores a function and various parameters for calculating the damage value of the dummy joint 212 and the target electrical joint 211. The fracture of the material due to a fatigue is determined by a value of a strain range and a repeated number. As representative examples, Coffin-Manson rule (the cycle number is about $10^3$ or less) represented by Equation (1) described below, and Basquin rule (the cycle number is about $10^4$ or more).

$$N_f = \alpha \Delta \epsilon^{-\beta} \quad (1)$$

$$D = N/N_f \quad (2)$$

$\Delta \epsilon$: strain range
$\alpha, \beta$: constant determined by material $N_f$: number of cycles to crack initiation (number of life cycles by which the material is fractured when the strain range $\Delta \epsilon$ is applied)
$N$: number of cycles in which the strain range $\Delta \epsilon$ is actually applied (number of repeated cycles)
$D$: damage value (ratio of the number of cycles added to the number of life cycles up to the present)

According to Miner's rule, the material is fractured at a point when the damage value reaches a fixed value (1 in Miner's rule) even if different loads, such as heat, vibration, and impact, are exerted in a complex manner (see an equation of $D_{th}+D_v=1$ described later). A life rule considering the damage by a creep phenomenon may be used.

The life prediction model is not only a model according to a deterministic function, but also may be a probability density distribution function considering indeterminacy. For example, the life prediction model may be a model in which parameters in Coffin-Manson rule or Basquin rule are in accordance with a probability distribution.

A composite load by a temperature variation and dynamic load (hereinafter, the vibration will be taken as an example) is considered as one example. The damage value by the temperature vibration is defined as $D_{th}$, and the damage value by the dynamic load is defined as $D_v$. The damage values $D_{th}$ and $D_v$ in which the material is fractured by the application of the single load are defined as 1 respectively. According to Miner's rule, if the different loads are exerted in a complex manner, the material is fractured when the sum of the damage values $D_{th}$ and $D_v$ is 1, i.e., the material is fractured in the state of Equation (3) described below.

$$D_{th}+D_v=1 \quad (3)$$

$$D_{th}=N_{th}/N_{f,th} \quad (4)$$

$$N_{f,th}=\alpha \Delta \epsilon_{th}^{-\beta} \quad (5)$$

$$D_v=N_v/N_{f,v} \quad (6)$$

$$N_{f,v}=\alpha \Delta \epsilon_v^{-\beta} \quad (7)$$

$D_{th}$, $D_v$: damage value (temperature damage value) by temperature variation, damage value (vibration damage value by vibration)
$N_{th}$, $N_v$: number of cycles (number of repeated cycles) in which strain ranges $\Delta \epsilon_{th}$, and $\Delta \epsilon_v$ are actually exerted due to the temperature variation and vibration
$N_{f,th}$, $N_{f,v}$: number of cycles to crack initiation by the strain ranges $\Delta \epsilon_{th}$, and $\Delta \epsilon_v$ caused by the temperature variation and vibration.

In the present embodiment, it is assumed that the strain range $\Delta \epsilon_v$ takes a fixed value. The damage value can substantially be calculated in the same manner by summing up the damage values by the strain ranges and the number of repeated cycles as indicated in Equation (8) described below, even if the strain range has a general waveform.

$$D_{sum}=N_1/N_{f,1}+N_2/N_{f,2}+\ldots+N_n/N_{f,n}=N_1/\alpha \Delta \epsilon_1^{-\beta}+N_2/\alpha \Delta \epsilon_2^{-\beta}+\ldots N_n/\alpha \Delta \epsilon_n^{-\beta} \quad (8)$$

$D_{sum}$: damage value obtained when different strain ranges are exerted
$\Delta \epsilon_1 \ldots \Delta \epsilon_n$: strain range
$N_1 \ldots N_n$: number of cycles in which the strain ranges $\Delta \epsilon_1 \ldots \Delta \epsilon_n$ are applied For each of the dummy joint 212 and the target electrical joint 211, the relationships of Equation (1) to Equation (7) (and Equation (8)) are acquired beforehand, and they are stored in the life prediction model base 244 as described above. The relationships in Equation (5) and Equation (7), which are the life prediction equations in the case where the load is not combined, are acquired by a material test using the solder electrical joint.

It has been described that the life prediction model is the model using the strain (or stress) as a variable. However, a life prediction model using the temperature range or the acceleration range as a variable may be employed. When the life prediction model using the strain (or stress) as a variable is used, a conversion equation or conversion table for calculating the strain range (or stress range) from the temperature range and the acceleration range are prepared. The conversion equation and the conversion table are created beforehand by a parameter survey in which thermal load conditions or acceleration conditions due to a stress analysis such as a finite element simulation are varied.

A set (calculation function of the damage value for thermal load) of Equations (4) and (5) related to the dummy joint 212 corresponds to a dummy damage function. A set (calculation function of the damage value for thermal load) of Equations (4) and (5) related to the target electrical joint 211 corresponds to a target damage function.

A set (calculation function of the damage value for dynamic load) of Equations (6) and (7) related to the dummy joint 212 also corresponds to the dummy damage function. A set (calculation function of the damage value for dynamic load) of Equations (6) and (7) related to the target electrical joint 211 also corresponds to the target damage function.

The life prediction model for thermal load may be classified into a fatigue life prediction model and a creep damage life prediction model, and the damage value may be classified into a fatigue damage value and a creep damage value. The life prediction model for dynamic load may be classified into a fatigue life prediction model and a creep damage life prediction model, and the damage value may be classified into a fatigue damage value and a creep damage value.

Next, the composite load model base 243 will be described.

As described above, the material is fractured in the state of Equation (3) (in the state in which the total of the damage values by the respective loads is 1) according to Miner's rule. However, when the composite load is exerted, the material is often fractured before the total of the damage values by the respective loads reaches 1. In view of this, the present embodiment employs a technique obtained by improving Miner's rule (Equation (3)).

Specifically, a test described below is carried out. That is, the respective loads are preliminarily combined by a test and a numerical simulation (according to a finite element method), and a time until the material is fractured is counted. By virtue of this test, the relationship between the data of the damage value for thermal load $D_{th}$ and the damage value for dynamic load $D_v$, and the condition as to whether the material is fractured or not is acquired for each of the dummy joint 212 and the target electrical joint 211, and the resultant is stored in the composite load model base 243. In the present embodiment, not Equation (3) but a probability density distribution function (or probability distribution function) using $D_{th}$ and $D_v$ as variables is used for various calculations (calibrations of life) described below. The relation of the function (composite load function) in Equation (9) may be present in the probability density distribution function. The $D_{th}$ and $D_v$ may be divided into a fatigue damage value $D_{fatigue}$ and creep damage value $D_{creep}$ respectively, which means four variables may be used.

$$D_{th}=f(D_v) \text{ or } D_v=f(D_{th}) \qquad (9)$$

In the probability density distribution function (or probability distribution function) using $D_{th}$ and $D_v$ as variables, a failure probability with a certain $D_{th}$ and certain $D_v$ is determined.

As the probability density distribution function, a curve indicating the relationship between $D_{th}$ and $D_v$ may be subject to a circular-arc approximation by using the curvature radius as a parameter, and the probability distribution related to this parameter may be set. A probability density function in which the occurrence frequency of $D_{th}$ and $D_v$ based upon the experimental result is approximated may be set.

Here, $f(D_{th})$ is a function returning the damage value caused by the temperature variation when the damage value $D_v$ by the vibration is applied; f(Dv) is a function returning the damage value $D_{th}$ caused by the vibration when the damage value by the temperature variation is applied.

In this case, the remaining life is involved with a distance (margin) between the current damage value (coordinate) and the probability density distribution using $D_{th}$ and $D_v$ as variables. As the damage progresses, the $D_{th}$ and $D_v$ become close to the probability density distribution, and at a point when they reach the probability density distribution, there is a possibility that the material is fractured. In this case, the probability distribution using the life (number of cycles) as a variable can be calculated from the relationship between the number of cycles of the thermal load and the dynamic load and time (a period of use or a period of maintenance and inspection) to the current damage value ($D_{th}$ and $D_v$).

Described next is a method of correcting the life prediction model and the composite load model in order that the damage value of the dummy joint 212 upon the fracture or the probability distribution (e.g., a point of 50%) related to the life is matched to the probability distribution (e.g., a point of 50%) of the composite load model, when the probability density distribution function using $D_{th}$ and $D_v$ as variables is used as the composite load model.

Basically, a model parameter is corrected in order that the data point of $D_{th}$ and $D_v$ at the point when the dummy joint 212 is fractured is located on a line of a prescribed probability point, such as a point of 50%, on the probability density distribution using $D_{th}$ and $D_v$ as variables. For example, when the damage value is a definite value, the model parameter is corrected in order that the distance between the data point of the damage value at the point when the dummy joint 212 is fractured and the line on the predetermined probability point in the probability density distribution becomes the minimum on the two-dimensional graph.

When the life prediction model is given as the probability density distribution, considering the indeterminacy of the data, the damage value also becomes the probability density distribution. In this case, the parameters in the life prediction model and the composite load model are corrected in order that the possibility of the fracture of the dummy joint 212 increases on the predetermined probability point in the probability density distribution that is the composite load model, by utilizing a statistical method such as Bayes method, for example.

When the $D_{th}$ and $D_v$ are classified into the fatigue damage value $D_{fatigue}$ and creep damage value $D_{creep}$, which means the probability density distribution is set by using four variables, the distance between the data point of the damage value at the point when the dummy joint 212 is fractured and the predetermined probability point in the probability density distribution is corrected on the four-dimensional graph by changing the parameters in the life prediction model and the composite load model.

The dummy life data and the target life data may have a form of a look-up table in which $D_v$ and $D_{th}$ are associated. Alternatively, the dummy life data and the target life data may be given as the composite load model (probability density distribution function) in which the failure probability is associated with $D_v$ and $D_{th}$ and its parameters.

In order to calculate the strain (or stress) at the electrical joint from the sensor temperature (temperature detected by the temperature sensor 221) or the sensor acceleration (acceleration detected by the acceleration sensor 222), it is considered that a relational expression or a table of the sensor value (sensor temperature or sensor acceleration) and the strain at the electrical joint is preliminarily prepared by performing a stress analysis using the temperature condition or acceleration condition as a parameter.

A method of determining the calculation method of the strain range $\Delta\epsilon$ will next be described. The strain range $\Delta\epsilon$ is an amount that cannot be measured from the real electrical joint, and it is determined by using a simulation such as the finite element method. Data of a reference experimental value (the temperature and acceleration of the semiconductor module) is acquired, and the relationship between the data of the reference experimental value and the strain caused on the electrical joint is acquired from the stress analysis. The repeated number $N_f$ upon the detection of the fracture is calculated from the data of the reference experimental value by a cycle count. The strain range $\Delta\epsilon$ (or stress amplitude) of the electrical joint is calculated from the data of the reference experimental value and the result of the stress analysis. The calculated strain range $\Delta\epsilon$ (or stress amplitude) is substituted into $N_f = \alpha \Delta\epsilon^{-\beta}$ that is the equation of the life prediction model base 244, whereby the life cycle is calculated.

Figure 18:
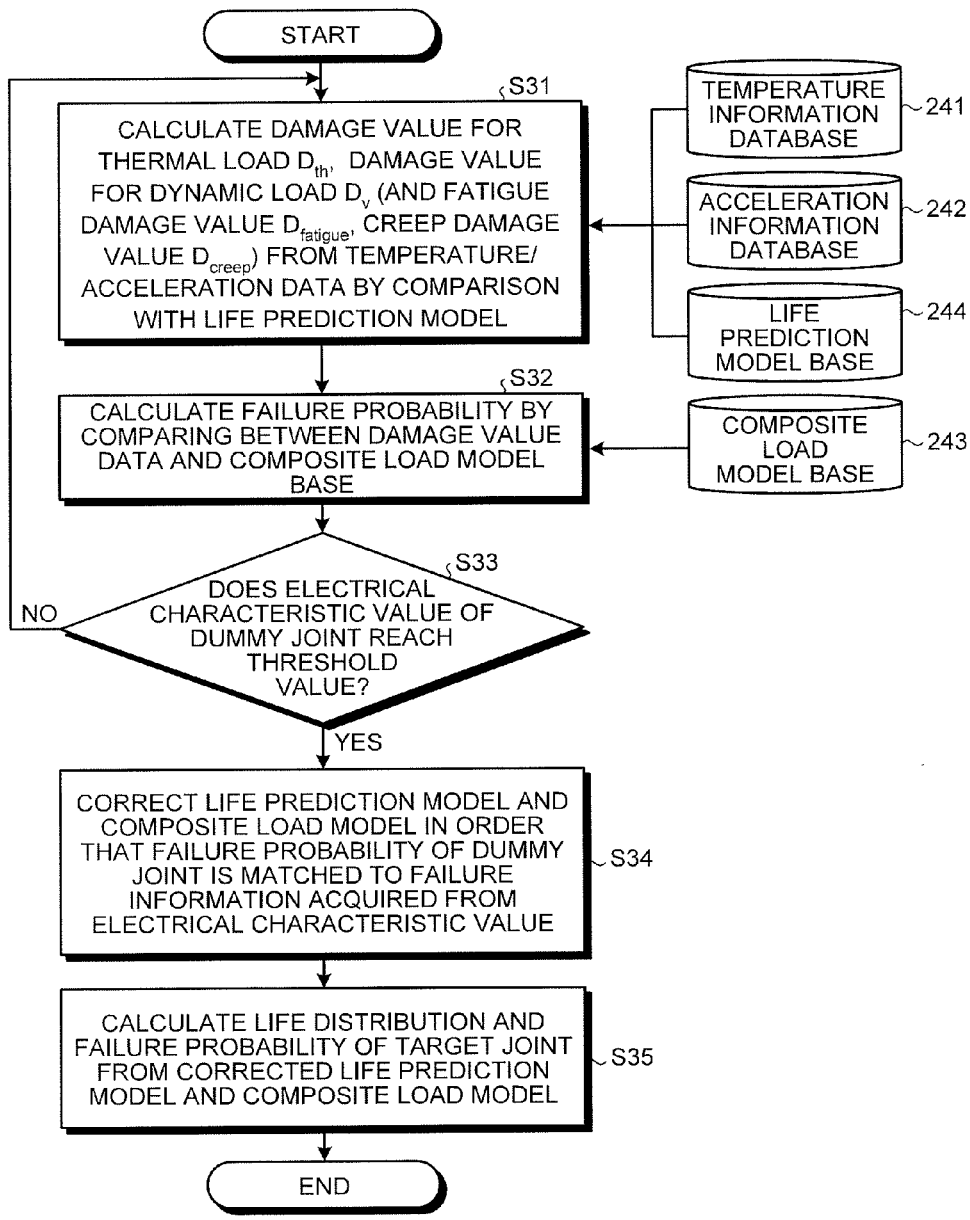
FIG. 18 is a flowchart of a life estimating process.

FIG. 18 is a flowchart illustrating one example of a flow of the life estimating process.

The calculation unit 231-2 utilizes the conversion equation to the strain range of the electrical joint from the temperature range and the acceleration range based upon the temperature history data stored in the temperature information database 241 and the acceleration history data stored in the acceleration information database 242, thereby calculating a data set of the strain range and the number of cycles. The calculation unit 231-2 calculates the damage value (damage value for thermal load and damage value for dynamic load) of the target electrical joint 211 by using the life prediction model base 244 (step S31). The calculation unit 231-2 also calculates the damage value (temperature damage value and damage value for dynamic load) for the dummy joint 212 in the same manner as for the target electrical joint 211. The calculation unit 231-2 stores the damage values (damage value for thermal load and the damage value for dynamic load) calculated for the target electrical joint 211 and the dummy joint 212 into the damage information database 245-2.

The calculation unit 231-2 calculates the failure probability from the composite load model by using the damage value (damage value for thermal load and the damage value for dynamic load) of the target electrical joint 211 as an input (step S32). When the calculated failure probability reaches a threshold value, the calculation unit 231-2 determines that the target electrical joint 211 reaches the end of its life. The calculation unit 231-2 records the situation that the target electrical joint 211 reaches the end of its life into the damage information database 245-2, and takes a predetermined action.

Examples of the considered action include an action of executing maintenance in case where the module is used in a company, and an action of reporting contact information of a user support to a user. Accordingly, a sign of the fracture can preliminarily be sensed, and an occurrence of failure in the market can be prevented by exchanging the component before the occurrence of failure.

The life is estimated periodically when a certain event is carried out. Examples of the event include maintenance and inspection, a time just after a power source is turned on, and a temperature rise more than an alarm temperature.

On the other hand, when the calculation unit 231-2 detects the fracture of the dummy joint 212 from the notification from the measuring module 9, the calculation unit 231-2 calculates the damage value for thermal load and the damage value for dynamic load of the dummy joint 212, and performs a calibration (correction) to the life prediction model and the composite load model of the target electrical joint 211 (step S33 to step S35). This will be described in detail below.

Firstly, the calculation unit 231-2 acquires the electrical characteristic value (here, resistance value) of the dummy joint 212 and the target electrical joint 211 through the measuring module 9 periodically or when a designation by a user is given. The calculation unit 231-2 checks whether the resistance value of the dummy joint 212 is not less than the threshold value or not (step S33). When it is less than the threshold value (step S33: No), the calculation unit 231-2 determines that the dummy joint 212 is not fractured, so that it does not execute the calibration to the life prediction model and the composite load model for the target electrical joint 211.

When the resistance value of the target electrical joint 211 is not less than the threshold value as described above, the calculation unit 231-2 determines that the target electrical joint 211 is fractured, and executes the predetermined action. When the resistance value of the target electrical joint 211 is less than the threshold value, the calculation unit 231-2 executes no action.

On the other hand, when the resistance value of the dummy joint 212 is not less than the threshold value (step S33: Yes), the calculation unit 231-2 utilizes the conversion equation to the strain range of the electrical joint from the temperature range and the acceleration range based upon the temperature history data stored in the temperature information database 241 and the acceleration history data stored in the acceleration information database 242, thereby calculating a data set of the strain range and the number of cycles. The calculation unit 231-2 calculates the damage value for thermal load and damage value for dynamic load of the dummy joint 212 by using the life prediction model base 244, and executes the calibration (correction) to the life prediction model and the composite load model of the target electrical joint 211 (step S34).

After the correction of the model, the calculation unit 231-2 utilizes the conversion equation to the strain range of the electrical joint from the temperature range and the acceleration range based upon the temperature history data stored in the temperature information database 241 and the acceleration history data stored in the acceleration information database 242, thereby calculating a data set of the strain range and the number of cycles. The calculation unit 231-2 calculates the damage value (damage value for thermal load and damage value for dynamic load) of the target electrical joint 211 by using the life prediction model base 244. The calculation unit 231-2 calculates the failure probability according to the composite load model by using the damage value (damage value for thermal load and damage value for dynamic load) of the target electrical joint 211 as an input (step S35). When the calculated failure probability reaches the threshold value, the calculation unit 231-2 determines that the target electrical joint 211 reaches the end of its life. The calculation unit 231-2 records the situation that the target electrical joint 211 reaches the end of its life into the damage information database 245-2, and takes a predetermined action.

When there are plural dummy joints 212, the process described for the relationship between the target electrical joint 211 and the dummy joint 212 is repeated every time the dummy joint 212 is fractured, whereby the life of the target electrical joint 211 can be predicted with high precision.

According to the present embodiment, in the life prediction of the electrical joint of the semiconductor module, the life prediction of the target electrical joint 211 can be calibrated (corrected) by the fracture of the dummy joint 212, whereby a highly precise prediction of the remaining life can be realized.

Modification 1 of Seventh Embodiment

In the embodiments and modifications described above, an example provided with one target electrical joint 211 has been described. A method according to the seventh embodiment can be applied to the case where plural target electrical joints 211, such as a solder bonding layer bonding a cooling structure and a module, a electrical joint of a device electrode (aluminum wire electrical joint, or a metal thin-film bonding layer with a copper electrode), and a metal thin-film bonding layer bonding a device and a circuit board, are present in the semiconductor module. Specifically, the method equal to the method in the present embodiment can be applied to each of the target electrical joints 211.

In this case, dummy joints 212 involved with the respective target electrical joints 211 are connected with a daisy chain, and when any one of them is fractured, the life prediction and calibration may be executed in the same manner as in the seventh embodiment. The fracture information of each of the dummy joints 212 corresponding to each of the target electrical joints 211 may be detected, and the life prediction and calibration may be executed in the same manner as in the seventh embodiment for each of the target electrical joints 211.

Modification 2 of Seventh Embodiment

Even when there are plural semiconductor modules, the life prediction and calibration may be executed by the same manner as in the seventh embodiment. In this case, dummy joints 212 involved with the respective target electrical joints 211 of each of the semiconductor modules are connected with a daisy chain, and when any one of them is fractured, the life prediction and calibration may be executed in the same manner as in the seventh embodiment. The fracture information of each of the dummy joints 212 corresponding to each of the target electrical joints 211 may be detected for each of the semiconductor modules, and the life prediction and calibration may be executed in the same manner as in the seventh embodiment for the target electrical joint 211 of each of the semiconductor modules.

When the dummy joint 212 cannot be provided on all semiconductor modules, which place is selected as the place where the dummy joint 212 is provided becomes an issue.

In this case, it is desirable that the place that is affected most by thermal loads and loads by external force be selected as the place where the dummy joint 212 is provided. For example, it is desirable that the dummy joint 212 be provided near a region where the thermal stress is the maximum, or that the dummy joint 212 be provided near a region where stress or strain caused by dynamic load is the maximum. It is also desirable that the optimum condition described above be selected such that the deformation or stress is checked beforehand by an experiment or numerical simulation, in order to consider the load to which top priority is given.

The calibration (correction) can be executed at the point when the dummy joint 212 is fractured by the same manner as in the seventh embodiment, even if the dummy joint 212 and the target electrical joint 211 are different components, or even if the dummy joint 212 and the target electrical joint 211 have different shapes, although they are the same type of components (e.g., the electrical joint).

The seventh embodiment can realize a life prediction considering the influence of the composite load in which a thermal load (the thermal load may be considered as being classified into a low-cycle fatigue, high-cycle fatigue, and a creep) and a dynamic load (the dynamic load may be considered as being classified into a low-cycle fatigue, high-cycle fatigue, and a creep) are mixed. The seventh embodiment can also provide an electronic apparatus or a semiconductor module whose damage can be detected before the electrical joint of the semiconductor module is damaged fatally or damaged to a degree exceeding a permissible range.

As described above, according to the first to seventh embodiments, the damage on the electrical joint can preliminarily be sensed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a first member serving as a circuit board member;
   a second member serving as a circuit board member or a semiconductor device;
   a first electrode formed on the first member;
   a second electrode formed on a region, of the first member, around a region where the first electrode is formed, to surround the first electrode;
   a third electrode formed on the second member;
   a first electrical joint configured to bond the first electrode and the third electrode;
   a second electrical joint configured to bond the second electrode and the third electrode, the second electrical joint being separated from the first electrical joint; and
   a measuring module configured to measure an electrical characteristic value of a connection path including the first electrode.

2. The electronic apparatus according to claim 1, wherein the first electrode includes plural electrodes that are separated from one another.

3. The electronic apparatus according to claim 2, wherein the connection path includes at least two of the plural electrodes or the connection path includes the second electrode and at least one of the plural electrodes.

4. The electronic apparatus according to claim 1, wherein the region where the first electrode is formed includes a region, of the first member, closest to a connection portion between a conductive member connected to the second member and the second member.

5. The electronic apparatus according to claim 2, wherein a region where at least one of the plural electrodes is formed includes a region, of the first member, closest to a connection portion between a conductive member connected to the second member and the second member.

6. The electronic apparatus according to claim 1, wherein a gap is formed between the first electrode and the second electrode.

7. The electronic apparatus according to claim 2, wherein a gap is formed between the plural electrodes, and a gap is formed between the plural electrodes and the second electrode.

8. The electronic apparatus according to claim 1, wherein a resist is formed between the first electrode and the second electrode.

9. The electronic apparatus according to claim 2, wherein a resist is formed between the plural electrodes, and a resist is formed between the plural electrodes and the second electrode.

10. An electronic apparatus comprising:
a first member serving as a circuit board member;
a second member serving as a circuit board member or a semiconductor device;
a first electrode formed on the first member;
a second electrode formed on a region, of the first member, around a region where the first electrode is formed;
a third electrode formed on the second member;
a electrical joint configured to bond the first electrode, the second electrode, and the third electrode;
a measuring module configured to measure an electrical characteristic value of a connection path, the measuring module including a plurality of measuring modules that measure electric properties of plural different connection paths, respectively, each of the connection paths including at least one of the first electrode and the second electrode; and
a calculation unit configured to calculate a damage-related index on the electrical joint based upon a relationship determined for the connection path whose electrical characteristic value is measured, out of relationships, which are determined for the respective measuring modules, between the electrical characteristic value and the damage-related index on the electrical joint, and the measured electrical characteristic value.

11. The electronic apparatus according to claim 10, further comprising an output unit configured to output a calculation result obtained by the calculation unit.

12. The electronic apparatus according to claim 1, further comprising:
a fourth electrode formed under the first member; and
a fifth electrode formed on a back surface of the second member, the back surface being reverse to a surface on which the third electrode is formed, wherein
the connection path connects at least one of the first electrode and the second electrode and at least one of the third electrode, the fourth electrode, and the fifth electrode.

13. An electronic apparatus comprising:
a first member serving as a circuit board member;
a second member serving as a circuit board member or a semiconductor device;
a first electrode formed on the first member;
a second electrode formed on the second member;
a third electrode formed on a region, of the second member, around a region where the second electrode is formed, to surround the second electrode;
a first electrical joint configured to bond the first electrode and the second electrode;
a second electrical joint configured to bond the first electrode and the third electrode, the second electrical joint being separated from the first electrical joint; and
a measuring module configured to measure an electrical characteristic value of a connection path including the second electrode.

14. A measuring method for an electronic apparatus, the method comprising:
measuring an electrical characteristic value of a connection path including at least one of a first electrode and a second electrode, wherein the electronic apparatus comprises:
a first member serving as a circuit board member,
a second member serving as a circuit board member or a semiconductor device,
the first electrode formed on the first member,
the second electrode formed on a region, on the first member, around a region where the first electrode is formed, to surround the first electrode,
a third electrode formed on the second member,
a first electrical joint configured to bond the first electrode and the third electrode, and
a second electrical joint configured to bond the second electrode and the third electrode, the second electrical joint being separated from the first electrical joint.

15. A measuring method for an electronic apparatus, the method comprising:
measuring an electrical characteristic value of a connection path including at least one of the second electrode and the third electrode, wherein the electronic apparatus comprises:
a first member serving as a circuit board member,
a second member serving as a circuit board member or a semiconductor device,
a first electrode formed on the first member,
the second electrode formed on the second member,
the third electrode formed on a region, of the second member, around a region where the second electrode is formed, to surround the second electrode,
a first electrical joint configured to bond the first electrode and
the second electrode and a second electrical joint configured to bond the first electrode and the third electrode, the second electrical joint being separated from the first electrical joint.

* * * * *